(12) United States Patent
Itoi et al.

(10) Patent No.: US 7,429,779 B2
(45) Date of Patent: Sep. 30, 2008

(54) SEMICONDUCTOR DEVICE HAVING GATE ELECTRODE CONNECTION TO WIRING LAYER

(75) Inventors: Kazuhisa Itoi, Tokyo (JP); Masakazu Sato, Tokyo (JP); Tatsuya Ito, Tokyo (JP)

(73) Assignee: Fujikura Ltd., Tokyo (JP)

( * ) Notice: Subject to any disclaimer, the term of this patent is extended or adjusted under 35 U.S.C. 154(b) by 178 days.

(21) Appl. No.: 11/189,134

(22) Filed: Jul. 26, 2005

(65) Prior Publication Data

US 2006/0022287 A1 Feb. 2, 2006

(30) Foreign Application Priority Data

Jul. 29, 2004 (JP) ............................. P2004-221785
Oct. 18, 2004 (JP) ............................. P2004-302696

(51) Int. Cl.
*H01L 43/00* (2006.01)
(52) U.S. Cl. ........................ 257/528; 257/754
(58) Field of Classification Search ....................... None
See application file for complete search history.

(56) References Cited

U.S. PATENT DOCUMENTS

| | | | |
|---|---|---|---|
| 6,133,079 A | 10/2000 | Zhu et al. | |
| 6,153,489 A | 11/2000 | Park et al. | |
| 2002/0017730 A1 | 2/2002 | Tahara et al. | |
| 2002/0028557 A1 | 3/2002 | Lee et al. | |
| 2003/0076209 A1 | 4/2003 | Tsai et al. | |
| 2003/0148739 A1 | 8/2003 | Koswmura et al. | |

FOREIGN PATENT DOCUMENTS

| | | |
|---|---|---|
| JP | 2003-86690 | 3/2003 |
| WO | WO 00/77844 | 12/2000 |

OTHER PUBLICATIONS

Wolf et al., Silicon Processing for the VLSI Era, 2000, vol. 1, Lattice Press, 793.*

(Continued)

*Primary Examiner*—Leonardo Andújar
(74) *Attorney, Agent, or Firm*—Westerman, Hattori, Daniels & Adrian, LLP.

(57) ABSTRACT

A semiconductor device includes a semiconductor substrate having an electrode formed above a surface thereof; a first insulating resin layer that is provided over the semiconductor substrate and has a first opening defined at a position corresponding to the electrode; a first wiring layer that is provided on the first insulating resin layer and is connected to the electrode through the first opening; a second insulating resin layer provided over the first insulating resin layer and the first wiring layer, the second insulating resin layer having a second opening that is defined at a position different from the position of the first opening in a direction of the surface of the semiconductor substrate; and a second wiring layer that is provided on the second insulating resin layer and is connected to the first wiring layer through the second opening, wherein the second wiring layer includes an induction element, and a sum of a thickness of the first insulating resin layer and a thickness of the second insulating resin layer is not less than 5 μm and not more than 60 μm.

4 Claims, 16 Drawing Sheets

OTHER PUBLICATIONS

G. J. Carchon et al., "High-Q Above-IC Inductors and Transmission Lines—Comparison to Cu Back-End Performance", 2004, Electronic Components and Technology Conference. pp. 1118-1123.

P. Pieters, et al., "High-Q Spiral Inductors for High Performance Integrated RF Front-End Sub-Systems", 2000 International Symposium on Microelectronics.

Official Communication issued on Sep. 17, 2006, together with Australian Search Report, on the counterpart Singapore Patent Application No. 200504595-0.

"New Developments in Incorporating Passive Components for System Integration: Forming an Inductor on a Chip"; Nikkei Microdevices, Mar. 2002, pp. 125-127.

* cited by examiner

SEMICONDUCTOR DEVICE HAVING GATE ELECTRODE CONNECTION TO WIRING LAYER

BACKGROUND OF THE INVENTION

1. Field of the Invention

The present invention relates to a semiconductor device and a method for manufacturing the same in which formation of a semiconductor having a induction element formed above a semiconductor substrate, such as a silicon wafer is done together with packaging thereof.

Priority is claimed on Japanese Patent Application No. 2004-221785, filed Jul. 29, 2004, and Japanese Patent Application No. 2004-302696, filed Oct. 18, 2004, the contents of which are incorporated herein by reference.

2. Description of Related Art

In recent years, in a fabrication of a high-frequency semiconductor element, an induction element, such as a spiral inductor, is formed on a semiconductor substrate for the purpose of ensuring impedance matching thereof or the like. In such a semiconductor element, however, a part of electromagnetic energy generated by the induction element is lost in the substrate or a wiring constructing the induction element due to parasitic capacitance between the wiring and the semiconductor substrate. This type of energy loss is disclosed in, for example, Japanese Unexamined Patent Application, First Publication No. 2003-86690.

One cause of this type of electromagnetic energy loss is a relatively close vertical distance between the wiring and the semiconductor substrate, which makes the influence of the parasitic capacitance significant. To eliminate such losses, one technique is proposed in which a thick resin layer is provided between the semiconductor substrate and the induction element so that loss of electromagnetic energy is prevented (see, for example, NIKKEI MICRODEVICES, March 2002, pp. 125-127).

FIGS. 1, 2A, and 2B illustrate an example of a conventional semiconductor device having a spiral coil. FIG. 1 is a plan view, FIG. 2A is a partially broken perspective view, and FIG. 2B is a cross-sectional view taken along line B-B shown in FIG. 1.

In a semiconductor device 20, a semiconductor substrate 1 includes an integrated circuit (IC) 2 formed thereon, and electrodes 3 and a passivation film 4 (insulator film) of the integrated circuit 2 are provided above the surface of the semiconductor substrate 1.

Furthermore, a lower wiring layer 21 that is connected to the electrodes 3 is formed on the passivation film 4 above the semiconductor substrate 1, and an insulating resin layer 22 is formed over the semiconductor substrate 1 and the lower wiring layer 21. Above the insulating resin layer 22, an upper wiring layer 23 having a spiral coil 24 is provided as a dielectric element. The spiral coil 24 is connected to the electrodes 3 of the integrated circuit 2 via the lower wiring layer 21.

FIGS. 3A to 3D are schematic cross-sectional views stepwise illustrating an exemplary method for manufacturing the semiconductor device shown in FIGS. 1, 2A, and 2B.

First, as shown in FIG. 3A, the semiconductor substrate 1 having the integrated circuit 2, the electrodes 3, and the passivation film 4 is provided. The semiconductor substrate 1 is, for example, a silicon wafer on which aluminum pads have been provided as the electrodes 3, which are covered with the passivation film 4 made of SiN, $SiO_2$, or the like. In the passivation film 4, openings 5 are defined in the positions corresponding to the electrodes 3, and the electrodes 3 are exposed from the openings 5. The passivation film 4 may be formed, for example, using any well-known method, such as the low-pressure chemical vapor deposition (LPCVD) technique, to a thickness of between 0.1 μm and 0.5 μm, for example.

Next, as shown in FIG. 3B, the lower wiring layer 21 is formed on the passivation film 4 above the semiconductor substrate 1. The lower wiring layer 21 is a redistribution layer (under path) that connects between the electrodes 3 and the spiral coil 24, and first ends 21a thereof are connected to the electrodes 3, and second ends 21b are connected to ends 23a and 23b of the upper wiring layer 23 that are provided above the lower wiring layer 21 (see FIG. 3D). The material of the lower wiring layer 21 may be, aluminum or copper, for example, and the thickness thereof may be between 0.1 μm and 10 μm, for example. The lower wiring layer 21 may be formed using any well-known method, for example, sputtering, evaporation, plating, or the like.

Next, as shown in FIG. 3C, the insulating resin layer 22 is formed over the passivation film 4 and the lower wiring layer 21 above the semiconductor substrate 1. The insulating resin layer 22 may be made of, for example, a polyimide resin, an epoxy resin, a silicone resin, or the like, and the thickness thereof may be between 0.1 μm and 10 μm, for example. The insulating resin layer 22 may be formed using any well-known method, for example, the spin coating method, the printing method, the lamination method, or the like. In the insulating resin layer 22, the openings 25 are defined in the positions corresponding to the second ends 21b of the lower wiring layer 21 (two openings are shown in FIGS. 3A to 3D). The openings 25 may be defined using a patterning technique or the like, by means of photolithography, for example.

Next, as shown in FIG. 3D, the upper wiring layer 23 having the spiral coil 24 is formed on the insulating resin layer 22. The ends 23a and 23b of the upper wiring layer 23 penetrates through the openings 25 defined in the insulating resin layer 22 and are connected to the second ends 21b of the lower wiring layer 21 through the openings 25. The material of the upper wiring layer 23 may be, for example, copper, and the thickness thereof may be, for example, between 1 μm and 20 μm. The upper wiring layer 23 may be formed, for example, using any well-known technique, such as electroplating.

Although the spiral coil 24 is formed in the upper wiring layer 23 in the conventional example shown in FIGS. 3A to 3D, the spiral coil 24 may be formed on the lower wiring layer 21 as shown FIGS. 4A to 4D. Next, a procedure for manufacturing a semiconductor device in which the spiral coil 24 is formed in the lower wiring layer 21 will be explained with reference to FIGS. 4A to 4D.

First, as shown in FIG. 4A, the semiconductor substrate 1 having the integrated circuit 2, the electrodes 3, and the passivation film 4 is provided. The description of the semiconductor substrate 1 shown in FIGS. 4A to 4D is omitted since it is similar to the semiconductor substrate 1 shown in FIG. 3A.

Next, as shown in FIG. 4B, the lower wiring layer 21 is formed on the passivation film 4 above the semiconductor substrate 1. The lower wiring layer 21 includes an interconnecting conductive layer 26 connected to the electrodes 3 and the spiral coil 24. The spiral coil 24 is to be connected to the interconnecting conductive layer 26 and the electrodes 3 in a later stage.

The material of the lower wiring layer 21 may be, aluminum or copper, for example, and the thickness of thereof may be between 0.1 μm and 10 μm, for example. The lower wiring layer 21 may be formed using any well-known method, for example, sputtering, evaporation, plating, or the like.

Next, as shown in FIG. 4C, the insulating resin layer 22 is formed over the passivation film 4 and the lower wiring layer 21 above the semiconductor substrate 1. The insulating resin layer 22 may be made of, for example, a polyimide resin, an epoxy resin, a silicone resin, or the like, and the thickness thereof may be between 0.1 μm and 10 μm, for example. The insulating resin layer 22 may be formed using any well-known method, for example, the spin coating method, the printing method, the lamination method, or the like. In the insulating resin layer 22, the openings 25 are defined in the positions corresponding to the interconnecting conductive layer 26 and ends 24a of the spiral coil 24 (two openings are shown in FIGS. 4C and 4D). The openings 25 may be defined using a patterning technique or the like, by means of photolithography, for example.

Next, as shown FIG. 4D, the upper wiring layer 23 is formed on the insulating resin layer 22. The two ends 23a and 23b of the upper wiring layer 23 penetrate through the openings 25 defined in the insulating resin layer 22, and are connected to the interconnecting conductive layer 26 and the ends 24a of the spiral coil 24, respectively. In this manner, the spiral coil 24 is connected to the electrodes 3 via the upper wiring layer 23 (over path) and the interconnecting conductive layer 26.

The material of the upper wiring layer 23 may be, for example, copper, and the thickness thereof may be, for example, between 1 μm and 20 μm. The upper wiring layer 23 may be formed, for example, using any well-known technique, such as electroplating.

However, the conventional semiconductor device 20 as shown in FIGS. 3A to 3D and FIGS. 4A to 4D still have shortcomings as follows.

Referring to FIG. 5, an equivalent circuit of the conventional semiconductor device is shown. In FIG. 5, $C_s$ is the capacitance of the spiral coil, $R_s$ is the electrical resistance of the spiral coil, and $L_s$ is the inductance of the spiral coil. $C_{(ox+Resin)}$ is the capacitance of the passivation film and the insulating resin layer, $C_{si}$ is the capacitance of the semiconductor substrate (silicon substrate), and $R_{si}$ is the electrical resistance of the semiconductor substrate (silicon substrate).

Provision of the spiral coil 24 on the upper wiring layer 23 as shown in FIGS. 3A to 3D suffers from the following shortcomings (1) and (2).

(1) Because the lower wiring layer 21 and the semiconductor substrate 1 are close, $C_{Si}$ is increased due to parasitic capacitance, which results in energy loss.

(2) Because the lower wiring layer 21 and the upper wiring layer 23 (the spiral coil 24) are close, $C_S$ is increased, causing energy loss.

Provision of the spiral coil 24 on the lower wiring layer 21 as shown in FIGS. 4A to 4D suffers from the following shortcomings (1) and (2).

(1) Because the lower wiring layer 24 and the semiconductor substrate 1 are close, $R_{Si}$ is increased due to eddy current loss, which results in energy loss.

(2) Because the lower wiring layer 21 and the upper wiring layer 23 (the spiral coil 24) are close, $C_S$ is increased, causing energy loss.

As described previously, in recent years, in a fabrication of a high-frequency semiconductor element, an induction element, such as a spiral inductor, is formed on a semiconductor substrate for the purpose of ensuring impedance matching thereof or the like (see, for example, Japanese Unexamined Patent Application, First Publication No. 2003-86690). Therefore, one technique is proposed in which a thick resin layer is provided between the semiconductor substrate and the induction element so that loss of electromagnetic energy is reduced.

In a conventional semiconductor device, however, a multi-layered wiring structure may be required. In such a case, impedance mismatching occurs at the junctions (contact holes) that connect an induction element and a wiring that are formed in the different layers, which may result in a decrease in the quality factor value (Q value).

SUMMARY OF THE INVENTION

The present invention was conceived in light of the above-described background, and one object thereof is to provide a low energy-loss and high performance semiconductor device having an induction element formed thereabove.

In order to solve the first aspect of the above problems is directed to a semiconductor device including: a semiconductor substrate having an electrode formed above a surface thereof; a first insulating resin layer that is provided over the semiconductor substrate and has a first opening defined at a position corresponding to the electrode; a first wiring layer that is provided on the first insulating resin layer and is connected to the electrode through the first opening; a second insulating resin layer provided over the first insulating resin layer and the first wiring layer, the second insulating resin layer having a second opening that is defined at a position different from the position of the first opening in a direction of the surface of the semiconductor substrate; and a second wiring layer that is provided on the second insulating resin layer and is connected to the first wiring layer through the second opening, wherein the second wiring layer includes an induction element, and a sum of a thickness of the first insulating resin layer and a thickness of the second insulating resin layer is not less than 5 μm and not more than 60 μm.

According to a second aspect of the present invention, in the above-described semiconductor device, a value obtained by dividing a thickness of the first wiring layer by a thickness of the second wiring layer may be between 0.3 and 0.5.

According to a third aspect of the present invention, the induction element may be a spiral coil.

Furthermore, a fourth aspect of the present invention is directed to a method for manufacturing a semiconductor device, including the steps of: forming a first insulating resin layer over a semiconductor substrate having an electrode provided thereabove; defining a first opening in the first insulating resin layer such that the electrode is exposed; forming, on the first insulating resin layer, a first wiring layer connected to the electrode through the first opening; forming, over the first insulating resin layer and the first wiring layer, a second insulating resin layer; forming a second opening at a position different from a position of the first opening in a direction of the surface of the semiconductor substrate, a position of the second opening corresponding to a position of the first wiring layer; and forming, on the second insulating resin layer, a second wiring layer that is connected to the first wiring layer through the second opening and functions as an induction element, wherein a sum of a thickness of the first insulating resin layer and a thickness of the second insulating resin layer is not less than 5 μm and not more than 60 μm.

According to a fifth aspect of the present invention, in the above-described method for manufacturing semiconductor device, a value obtained by dividing a thickness of the first wiring layer by a thickness of the second wiring layer may be between 0.3 and 0.5.

According to the present invention, since the first insulating resin layer and the second insulating resin layer are provided between the induction element, such as a spiral coil, and the semiconductor substrate, the induction element and the semiconductor substrate are spaced apart with a sufficient distance by the two insulating resin layers. In this manner, energy loss, such as eddy current loss, can be reduced, and a semiconductor device having a dielectric element that exhibits a high Q value (quality factor) and excellent characteristics can be obtained.

Furthermore, the present invention was conceived in light of the above-described background, and another object thereof is to provide a semiconductor device having an induction element that exhibits a high Q value.

A sixth aspect of the present invention is directed to a semiconductor device including: a semiconductor substrate having an electrode formed above a surface thereof; a first insulating resin layer that is provided over the semiconductor substrate and has a first opening defined at a position corresponding to the electrode; a wiring layer that is formed above the first insulating resin layer and is connected to the electrode through the first opening; a second insulating resin layer that is formed over the first insulating resin layer and the first wiring layer in the position corresponding to the first wiring layer, the second insulating resin layer having a second opening; and a second wiring layer that is formed on the second insulating resin layer and has an induction element, wherein the second wiring layer is connected to the first wiring layer via a junction provided in the second opening, and a width of the junction is equal to or greater than a line width of the second wiring layer that constructs the induction element.

According to a seventh aspect of the present invention, in the above-described semiconductor device, a first contact pad and a second contact pad may be provided to the first wiring layer and the second wiring layer, respectively, the junction may be provided between the first contact pad of the first wiring layer and the second contact pad of the second wiring layer, and a difference between a width C of at least one of the first contact pad of the first wiring layer and the second contact pad of the second wiring layer and a width A of the junction (C−A) may be 30 μm or less.

According to an eighth aspect of the present invention, in the above-described semiconductor device, the induction element may be a spiral coil.

According to a ninth aspect of the present invention, in the above-described semiconductor device, the contact pad may have one of a substantially rectangular shape and a substantially circular shape.

According to the present invention, since the junction is formed so that the width thereof is same as or greater than that of the second wiring layer that constructs the induction element, the flow of current is not blocked at the junction and loss can be reduced. In particular, impedance mismatching within the induction element can be prevented at high frequencies.

Accordingly, a semiconductor device having an induction element with a high Q value (quality factor) can be obtained.

DETAILED DESCRIPTION OF THE INVENTION

Hereinafter, the present invention will be described based on preferable embodiment with reference to the drawings.

Figure 6:
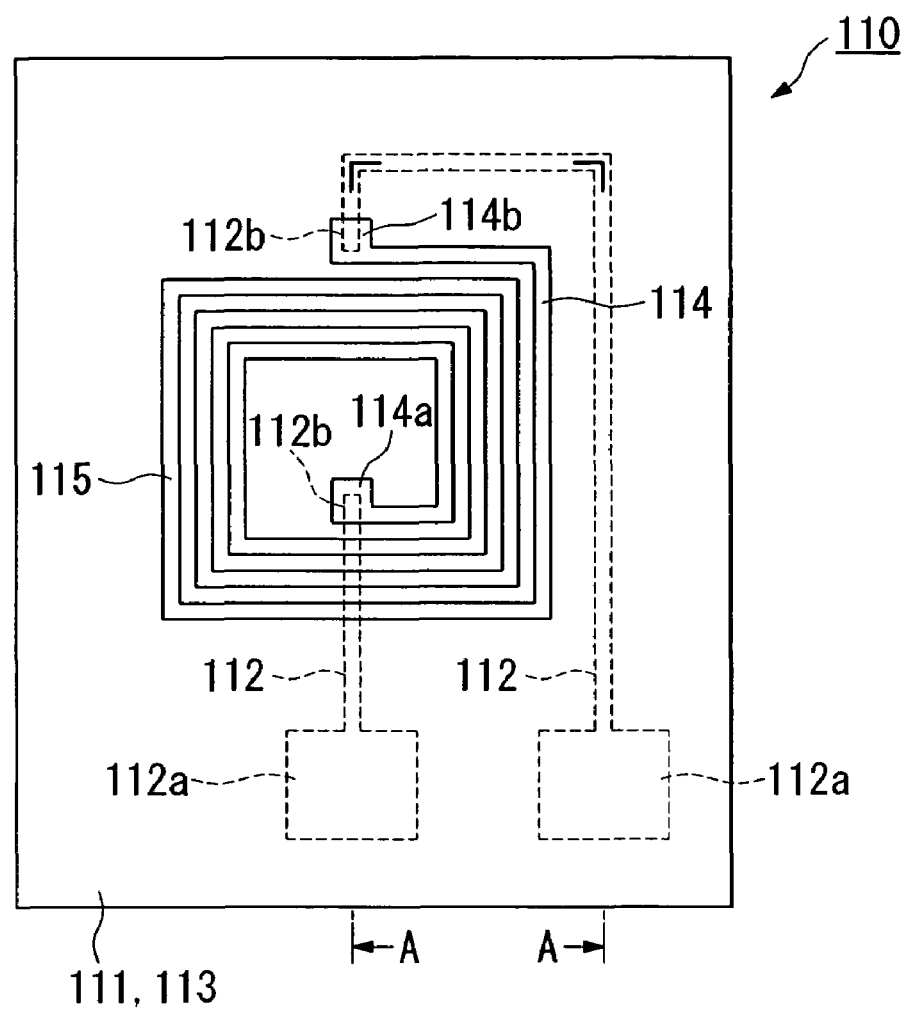
FIG. 6 is a plan view illustrating one example of a semiconductor device according to the present invention.
Figures 7A, 7B:
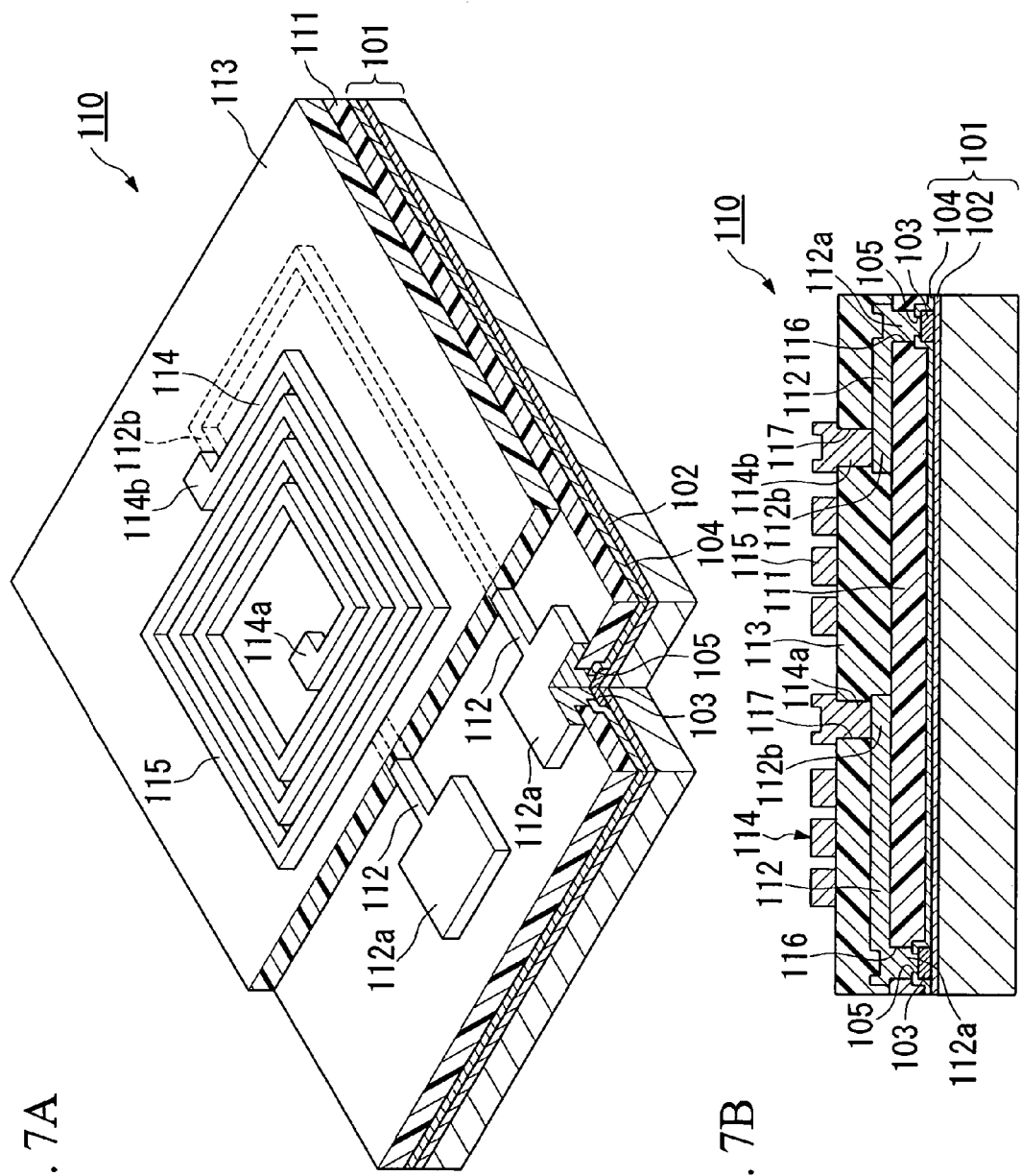
FIG. 7A is a partially broken perspective view illustrating one example of a semiconductor device according to the present invention.
FIG. 7B is a cross-sectional view illustrating an example of the semiconductor device according to the present invention taken along line A-A in FIG. 6.

FIG. 6 and FIGS. 7A and 7B show an example of the semiconductor device according to the present invention. FIG. 6 is a plan view, FIG. 7A is a partially broken perspective view, and FIG. 7B is a cross-sectional view taken along line A-A shown in FIG. 6.

In a semiconductor device 110, a semiconductor substrate 101 has an integrated circuit (IC) 102 formed thereabove, and electrodes 103 and a passivation film 104 of the integrated circuit 102 are provided above the surface of the semiconductor substrate 101.

This semiconductor device 110 further includes a first insulating resin layer 111 provided on the passivation film 104 of the semiconductor substrate 101, a first wiring layer 112 formed on the first insulating resin layer 111, a second insulating resin layer 113 formed over the first insulating resin layer 111 and the first wiring layer 112, and a second wiring layer 114 formed on the second insulating resin layer 113.

The semiconductor substrate 101 is, for example, a silicon wafer above which aluminum pads are provided as the electrodes 103, on which a passivation film 104, such as SiN or $SiO_2$ (a passivated insulator film) is formed. Openings 105 are defined in the passivation film 104 in the positions corresponding to electrodes 103, and the electrodes 103 are exposed from the openings 105. The passivation film 104 may be formed, for example, using any well-known method, such as the LPCVD technique, and the film thickness thereof is between 0.1 μm and 0.5 μm, for example.

In this embodiment, the electrodes 103 that connect the wiring layer having a spiral coil 115 to the integrated circuit 102 are provided in two positions on the surface of the semiconductor substrate 101.

According to the present invention, the semiconductor substrate may be a semiconductor wafer, such as a silicon wafer, or may be a semiconductor chip that is obtained by dicing a semiconductor wafer to the size of a chip. In the case where the semiconductor substrate is a semiconductor chip, a plurality of semiconductor chips can be obtained by forming groups of various semiconductor elements, ICs, or induction elements on a semiconductor wafer, and then dicing the semiconductor wafer to the size of the chip.

Although a portion of the semiconductor device with one induction element formed on the semiconductor substrate is shown in FIG. 6 and FIGS. 7A and 7B, it should be noted that the present invention is applicable to form a plurality of induction elements on a semiconductor substrate, such as semiconductor wafer. It should also be noted that various structures are additionally provided, such as a sealing layer for sealing the second wiring layer 114, output terminals to outside elements, such as bumps, or the like, to the semiconductor device according to the present invention, although such additional structures are not shown in the figures.

The first insulating resin layer 111 has first openings 116 defined in the position corresponding to each of the electrodes 103. The first insulating resin layer 111 may be made of, for example, a polyimide resin, an epoxy resin, a silicone resin, or the like, and the thickness thereof may be, for example, between 1 μm and 30 μm.

The first insulating resin layer 111 may be formed using any well-known method, for example, the spin coating method, the printing method, the lamination method, or the like. Furthermore, the first opening 116 may be defined using a patterning technique or the like, by means of photolithography, for example.

The second insulating resin layer 113 has second openings 117 that are defined in the positions different from the positions of the first opening 116 in the direction of the surface of the semiconductor substrate 101. The second openings 117 are defined in the positions corresponding to ends 114a and 114b of the second wiring layer 114.

The first wiring layer 112 is a redistribution layer that connects between the electrodes 103 and the spiral coil 115. First ends 112a of the first wiring layer 112 penetrate through the first insulating resin layer 111 through the first opening 116, and are connected to the electrodes 103. Furthermore, second ends 112b of the first wiring layer 112 extend so as to align to the second openings 117.

The material of the first wiring layer 112 may be, for example, copper, and the thickness thereof may be, for example, between 1 μm and 20 μm. This ensures excellent conductivity. The first wiring layer 112 may be formed using, for example, a plating technique, such as copper electroplating or the like, sputtering, evaporation, or combination of any two or more of these methods.

The second wiring layer 114 includes the spiral coil 115 as a dielectric element. The ends 114a and 114b of the second wiring layer 114 penetrate through the second insulating resin layer 113 through the second opening 117, and are connected to the respective second end 112b of the first wiring layer 112.

The material of the second wiring layer 114 may be, for example, copper, and the thickness thereof may be, for example, between 1 μm and 20 μm. This ensures excellent conductivity. The second wiring layer 114 may be formed using, for example, a plating technique, such as copper electroplating or the like, sputtering, evaporation, or combination of any two or more of these methods.

A sealing layer (not shown) may be provided on the second insulating resin layer 113 and the second wiring layer 114 according to requirements, covering at least the second wiring layer 114.

The sealing layer may be made of, for example, a polyimide resin, an epoxy resin, a silicone resin, or the like, and the thickness thereof may be between 10 μm and 150 μm, for example. Openings for connecting to terminals of outside elements may be defined in the sealing layer.

Furthermore, in the semiconductor device 110 of this embodiment, the sum of the layer thickness of the first insulating resin layer 111 and the layer thickness of the second insulating resin layer 113 is not less than 5 μm and not more than 60 μm. By this, a semiconductor device having a dielectric element that exhibits a high Q value and excellent characteristics can be obtained, as described later.

In the semiconductor device of this embodiment, the layer thickness of the first wiring layer 112 is preferably smaller than the layer thickness of the second wiring layer 114. In particular, a value obtained by dividing the layer thickness of the first wiring layer 112 by the layer thickness of the second wiring layer 114 is preferably between 0.3 and 0.5.

Furthermore, the thickness of the first wiring layer 112 is preferably smaller than the thickness of the second insulating resin layer 113.

Next, a method for manufacturing the semiconductor device shown in FIG. 6 and FIGS. 7A and 7B will be explained.

FIGS. 8A to 8E are schematic cross-sectional views stepwise illustrating an example of a method for manufacturing the above-described semiconductor device. The cross-sectional views in FIGS. 8A to 8E are taken along line A-A shown in FIG. 6.

Figure 8A:
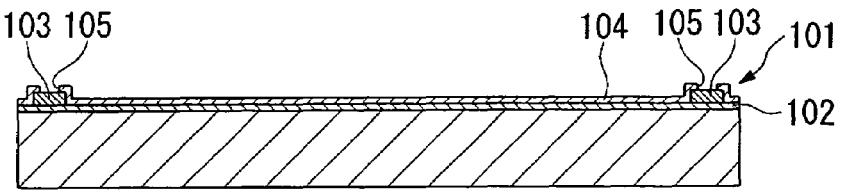
FIGS. 8A to 8E are schematic cross-sectional views stepwise illustrating an example of a method for manufacturing the semiconductor device shown in FIG. 6.

First, as shown in FIG. 8A, the semiconductor substrate 101 having the integrated circuit 102, the electrodes 103, and the passivation film 104 is provided.

As described above, the semiconductor substrate 101 is a semiconductor wafer having the electrodes 103 and the passivation film 104 formed above the surface threreof, and the openings 105 are defined in the passivation film 104 in the positions corresponding to electrodes 103.

Figure 8B:
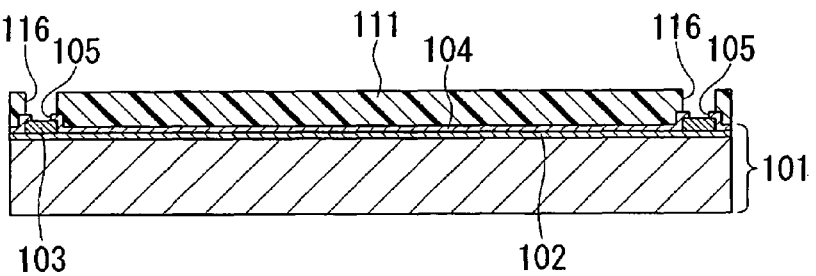

Next, as shown in FIG. 8B, the first insulating resin layer 111 having the first openings 116 is formed on the passivation film 104 of the semiconductor substrate 101.

The first insulating resin layer 111 may be formed, for example, by forming a film made of one or more of the above-described resins using any well-known method, for example, the spin coating method, the printing method, the lamination method, or the like, over the entire surface of the passivation film 104 (first insulating resin layer formation step), and then defining the first opening 116 using a patterning technique or the like, by means of photolithography, for example, in the positions corresponding to the electrodes 103 (first opening formation step).

Figure 8C:
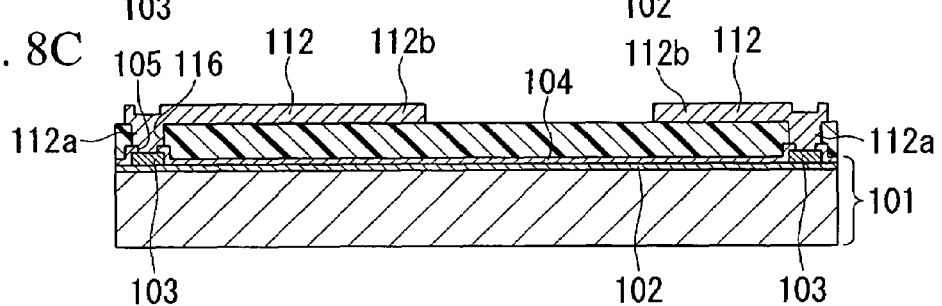

Next, as shown in FIG. 8C, the first wiring layer 112 is formed on the first insulating resin layer 111 (first wiring layer formation step). The particular method for forming the first wiring layer 112 in a predetermined position is not particularly limited, and the method disclosed in PCT International Application Publication No. WO00/077844 may be employed, for example.

Here, an example of a preferable method for forming the first wiring layer 112 will be explained.

First, a thin seed layer (not shown) for electroplating, which is to be carried out later, is formed by means of a sputtering technique or the like, over the entire surface of the first insulating resin layer 111 or selected regions thereof. The seed layer is, for example, a stacked body including a copper layer and a chromium (Cr) layer formed by means of sputtering, or a stacked body including a copper layer and a titanium (Ti) layer. Furthermore, the seed layer may be a electroless copper plating layer, or a thin metal layer formed using evaporation, a coating method, chemical vapor deposition (CVD), or the like, or a any combination of the above-described metal layer formation techniques.

Next, a resist layer (not shown) for electroplating is formed on the seed layer. Openings are defined in the resist layer in regions in which the first wiring layer 112 is to be formed, and the seed layer is exposed from the openings. The resist layer may be formed, for example, by laminating a film resist, spin coating a liquid resist, or by any other suitable method.

Then, the first wiring layer 112 is formed on the seed layer using the resist layer as a mask by means electroplating or the like. After forming the first wiring layer 112 in desired regions, unnecessary portions of the resist layer and the seed layer are removed by etching them so that the first insulating resin layer 111 is exposed except the regions where the first wiring layer 112 is formed (see FIG. 8C).

Figure 8D:
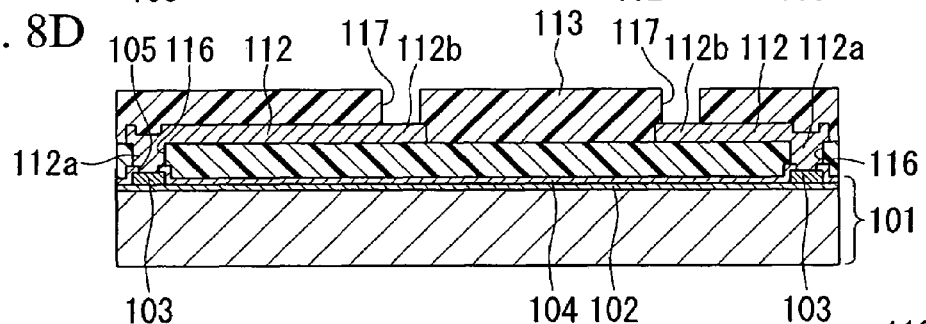

Next, as shown in FIG. 8D, the second insulating resin layer 113 is formed over the first insulating resin layer 111 and the first wiring layer 112.

The second insulating resin layer 113 may be formed, for example, by forming a film made of one or more of the above-described resins over the entire surface of the first insulating resin layer 111 and the first wiring layer 112 using any well-known method, for example, the spin coating method, the printing method, the lamination method, or the like (second insulating resin layer formation step), and then defining the second opening 117 using a patterning technique or the like, by means of photolithography, for example, in the positions corresponding to the second ends 112b of the first wiring layer 112 (second opening formation step).

Figure 8E:
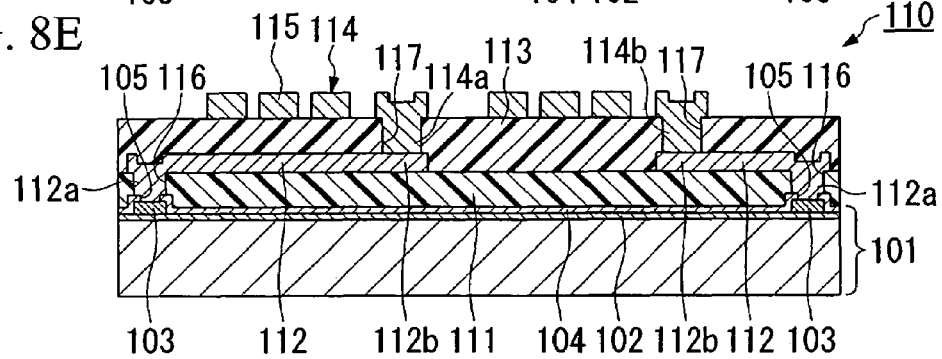

Next, as shown in FIG. 8E, the second wiring layer 114 having the spiral coil 115 is formed on the second insulating resin layer 113 (second wiring layer formation step). The particular method for providing the second wiring layer 114 in the predetermined region is similar to the method for providing the first wiring layer 112, and thus detailed description thereof will be omitted.

In the case where the sealing layer is provided above the second wiring layer 114, the sealing layer may be formed, for example, by patterning a photosensitive resin, such as a photosensitive polyimide resin, using photolithography to define openings in predetermined positions. It should be noted that the particular method for forming the sealing layer is not limited to this method, and various techniques may be used.

After forming the sealing layer, a semiconductor chip in which the induction element and the like are packaged can be obtained by dicing the semiconductor wafer having various structures, such as the induction element, thereon to a predetermined size.

Next, the operation and the effects of the semiconductor device of this embodiment will be explained.

Figure 1:
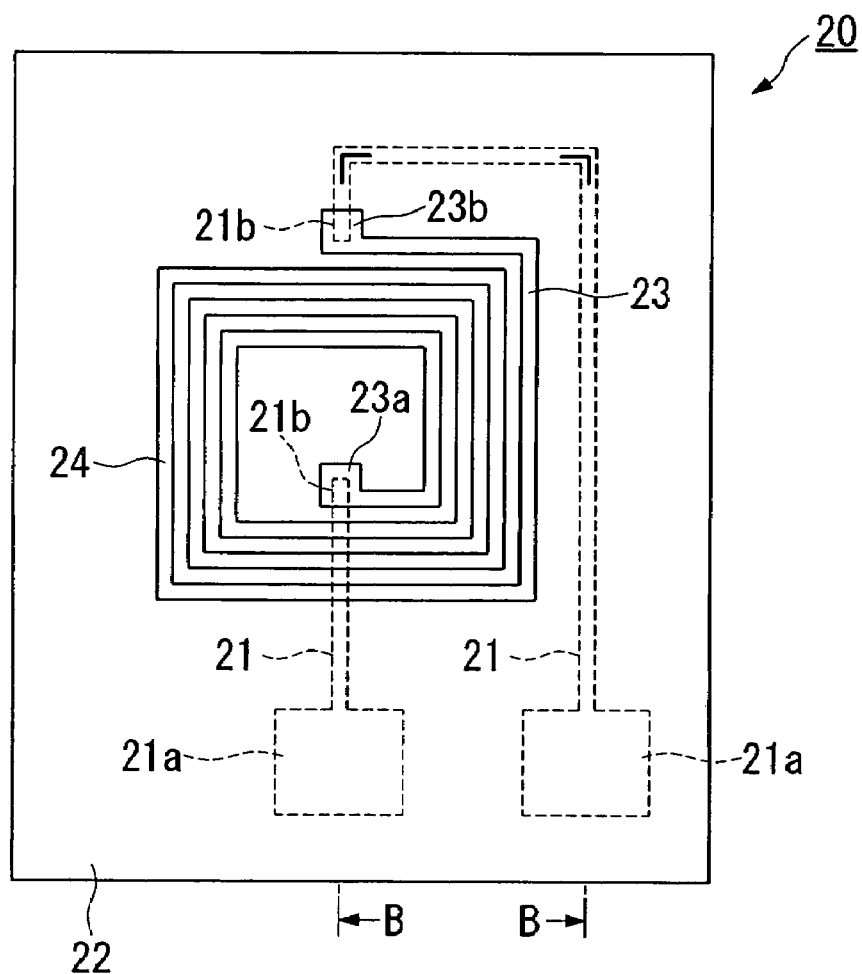
FIG. 1 is a plan view illustrating an example of a conventional semiconductor device.
Figures 2A, 2B:
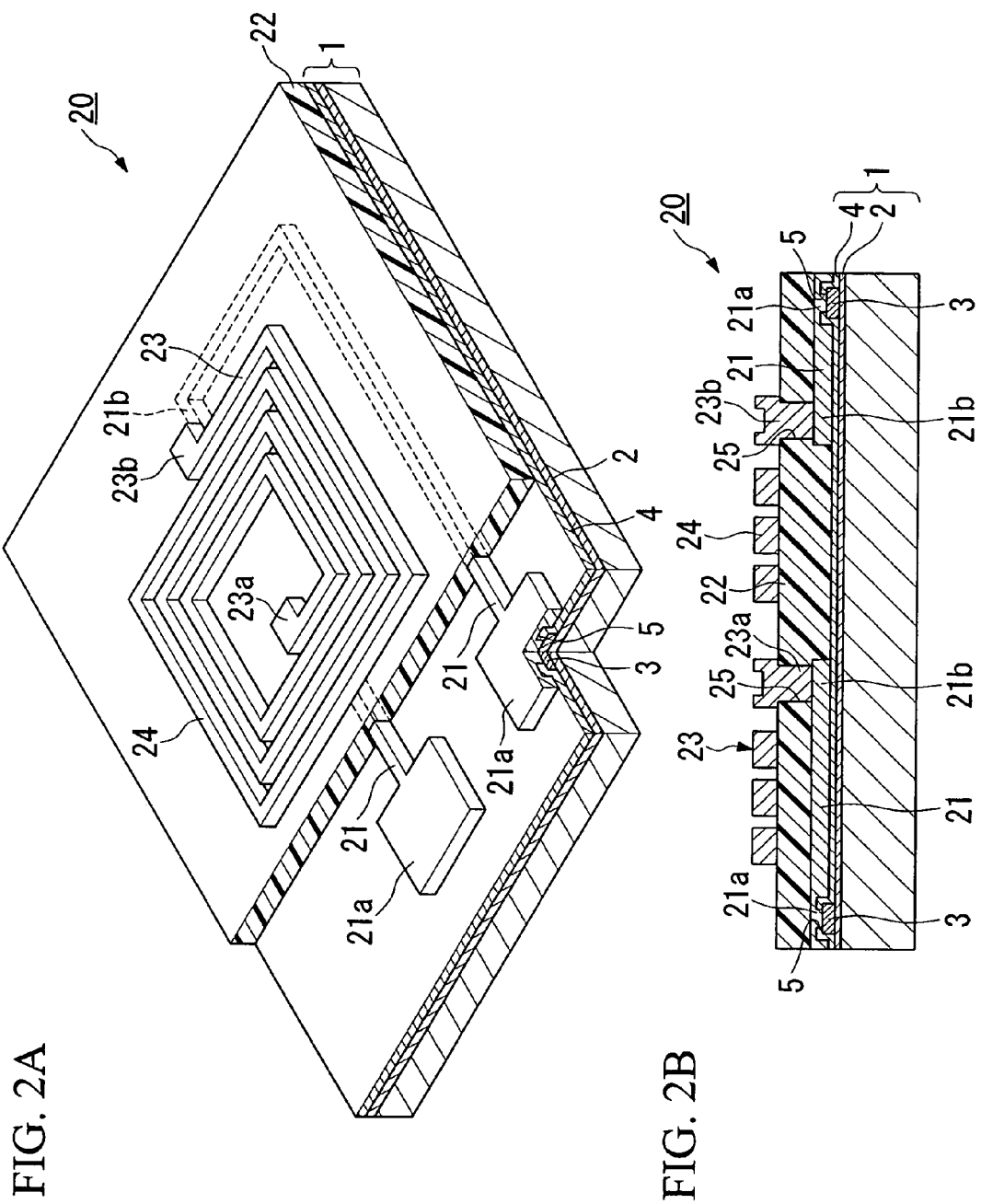
FIG. 2A is a partially broken perspective view of an example of the conventional semiconductor device.
FIG. 2B a cross-sectional view illustrating an example of the semiconductor device according to the present invention taken along line B-B in FIG. 1.
Figure 3A:
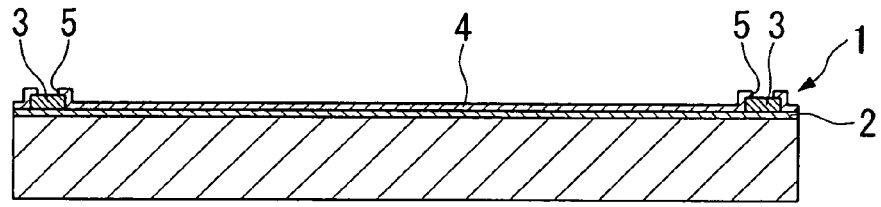
FIGS. 3A to 3D are schematic cross-sectional views stepwise illustrating an example of a method for manufacturing the semiconductor device shown in FIG. 1.
Figure 3B:
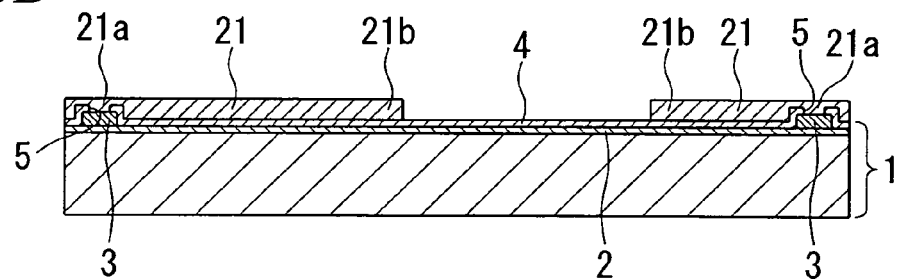
Figure 3C:
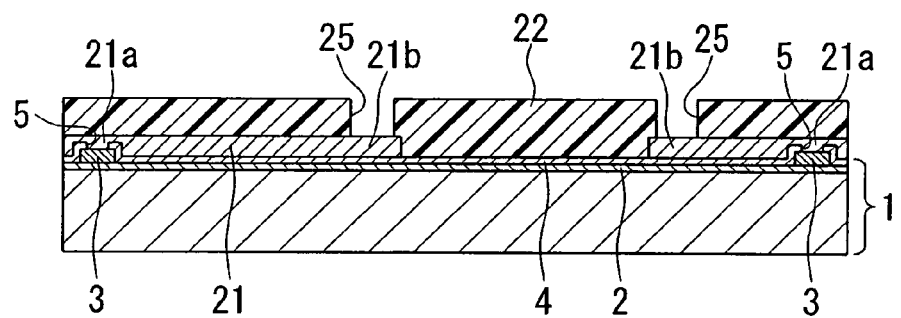
Figure 3D:
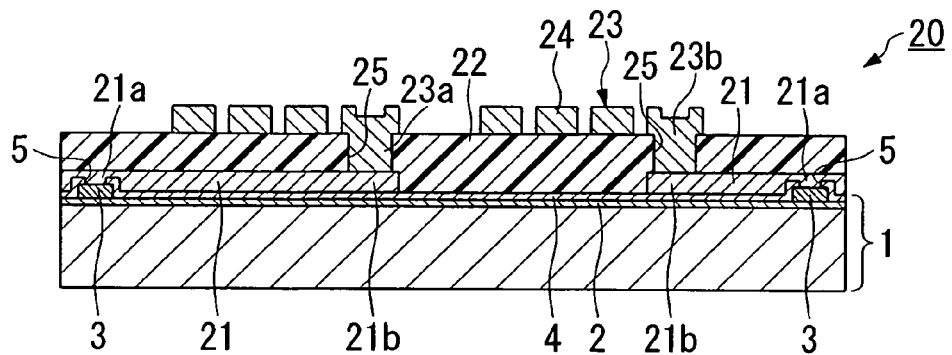
Figure 4A:
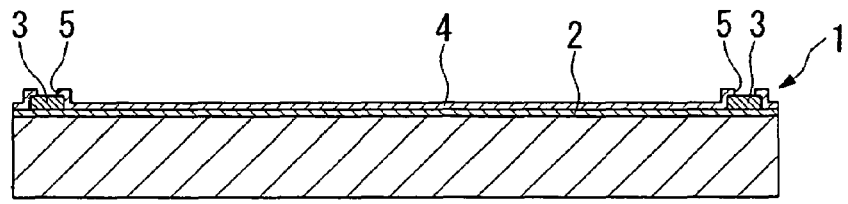
FIGS. 4A to 4D are schematic cross-sectional views illustrating an example of a method for manufacturing another example of a conventional stepwise semiconductor device.
Figure 4B:
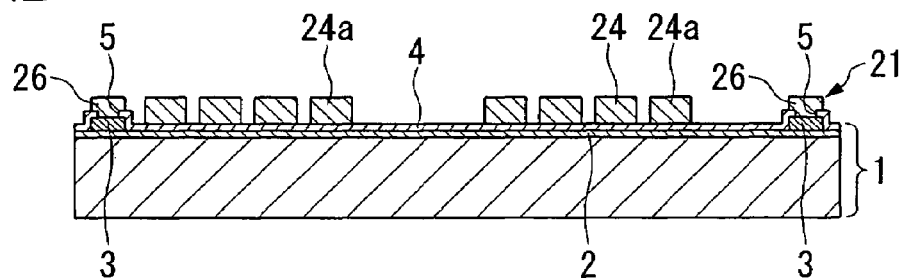
Figure 4C:
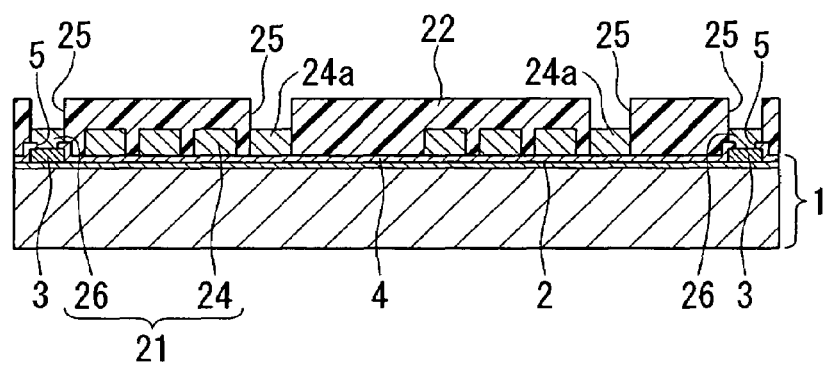
Figure 4D:
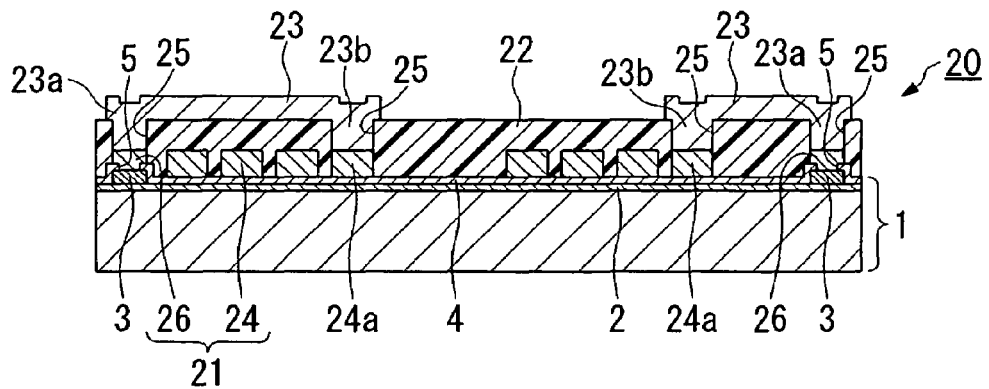
Figure 5:
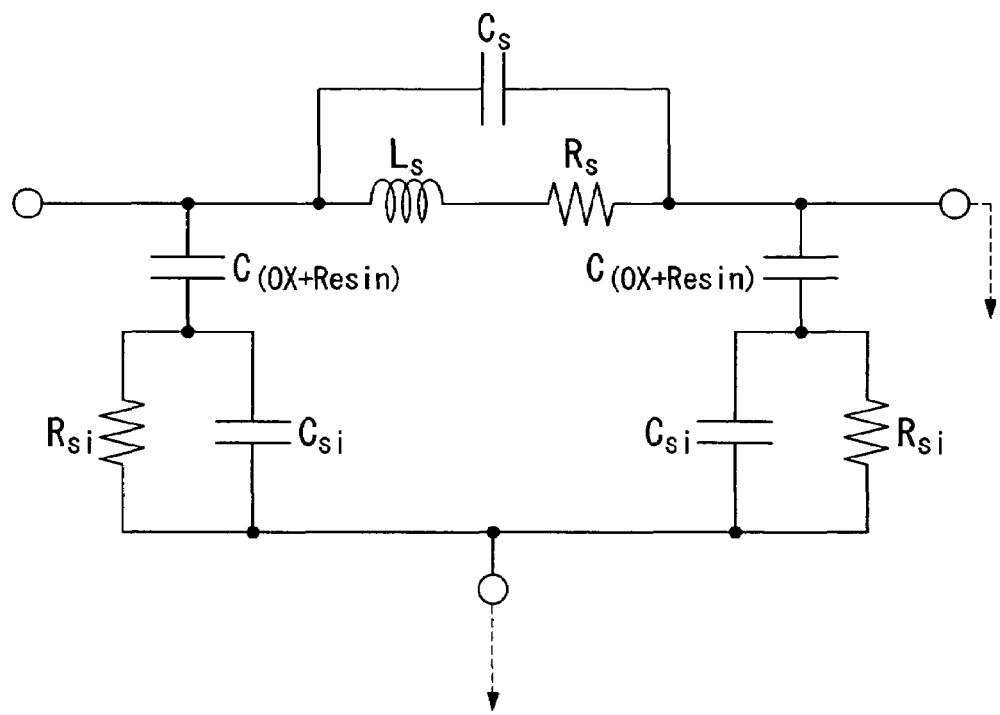
FIG. 5 is a circuit diagram showing an equivalent circuit of the conventional semiconductor device.

Since the first resin layer and the second resin layer are interposed between the semiconductor substrate and the dielectric element, the dielectric element and the semiconductor substrate are spaced apart with a sufficient distance. As a result, the resistance of the semiconductor substrate is decreased ($R_{Si}$ shown in FIG. 5), whereby reducing eddy current loss. Furthermore, the first wiring layer positioned close to the semiconductor substrate is an interconnection wiring connecting between the electrodes and the dielectric element, and the dielectric element is provided in the second wiring layer distant from the semiconductor substrate. Thus, since the dielectric element and the semiconductor substrate are spaced apart with a sufficient distance, the eddy current loss due to magnetic flux generated by the dielectric element can be reduced.

Furthermore, the first insulating resin layer and the second insulating resin layer are interposed between the semiconductor substrate and the dielectric element, and the sum of the thicknesses of these insulating resin layers is set to no less than 5 µm and not more than 60 µm. By this, preferable semiconductor devices having various advantages, such as greater increase in the Q value, smaller size, and reduced manufacturing cost, can be obtained. If the sum of the thicknesses of the two insulating resin layers is less than 5 µm, the improvement in the Q value is smaller, which is not desirable. Furthermore, the sum of the thicknesses of the two insulating resin layers of greater than 60 µm is not disadvantageous in terms of the manufacturing cost or manufacturing conditions since further increase in the Q value is not expected (see FIG. 10). In order to use the device as a dielectric element, the Q value is preferably 20 or higher.

In the semiconductor device of this embodiment, the inductor is made of the first wiring layer and the second wiring layer, among which the first wiring layer is an under path that connects between the electrodes on the semiconductor substrate and the dielectric element (coil) and the second wiring layer has the dielectric element (coil).

In this structure, the resistance of the second wiring layer becomes dominant in the resistance ($R_S$) of the inductor.

Furthermore, when the thicknesses of the first insulating resin layer and the second insulating resin layer are the same, if the thickness of the second insulating resin layer is too small, the distance between the first wiring layer and the second wiring layer is reduced. As a result, the effect of the energy loss becomes significant due to increased capacitance ($C_S$) of the inductor. This is because the second insulating resin layer (see FIGS. 7A and 7B) have two different portions: one directly formed on the first insulating resin layer and the other formed on the first wiring layer. If the first wiring layer is too thick, a resin may flow from the first wiring layer during formation of the second insulating resin layer and the thickness of the resin on the first wiring layer tends to become smaller than desired.

If the thickness of the first wiring layer is too small, the electrical resistance is reduced due to the reduction in the cross-sectional area of the first wiring layer, which is not desirable.

By maintaining a value obtained by dividing the layer thickness of the first wiring layer by the layer thickness of the second wiring layer to no less than 0.3 and not more than 0.5, the influence of increased capacitance ($C_S$) is reduced and a semiconductor device having further excellent characteristics can be realized.

EXAMPLES

Semiconductor devices were manufactured, and the characteristics thereof were evaluated. Silicon substrates were used as semiconductor substrates. The first insulating resin layer and the second insulating resin layer were formed from a polyimide resin. The first wiring layer were provided between the first insulating resin layer and the second insulating resin layer, and the second wiring layer was provided on the second insulating resin layer. The dielectric element was formed as a 3.5-turn spiral coil. Copper (Cu) was used as the material of the first second wiring layer and second wiring layer.

Position of Induction Element

As a working example of the present invention, semiconductor devices having a first wiring layer positioned close to a semiconductor substrate as an interconnection wiring (under path), and a second wiring layer distant from the semiconductor substrate as a dielectric element were manufactured. As a comparative example, semiconductor devices having a first wiring layer positioned close to the semiconductor substrate as a dielectric element, and a second wiring layer distant from the semiconductor substrate as an interconnection wiring (over path) were manufactured. For these semiconductor devices, the relationship between frequency and Q value was evaluated.

The semiconductor elements of the working example and the semiconductor elements of the comparative example were manufactured under the same conditions, such as the thicknesses of the insulating resin layers, of the working examples, except for the positions of the induction element as described above.

Figure 9:
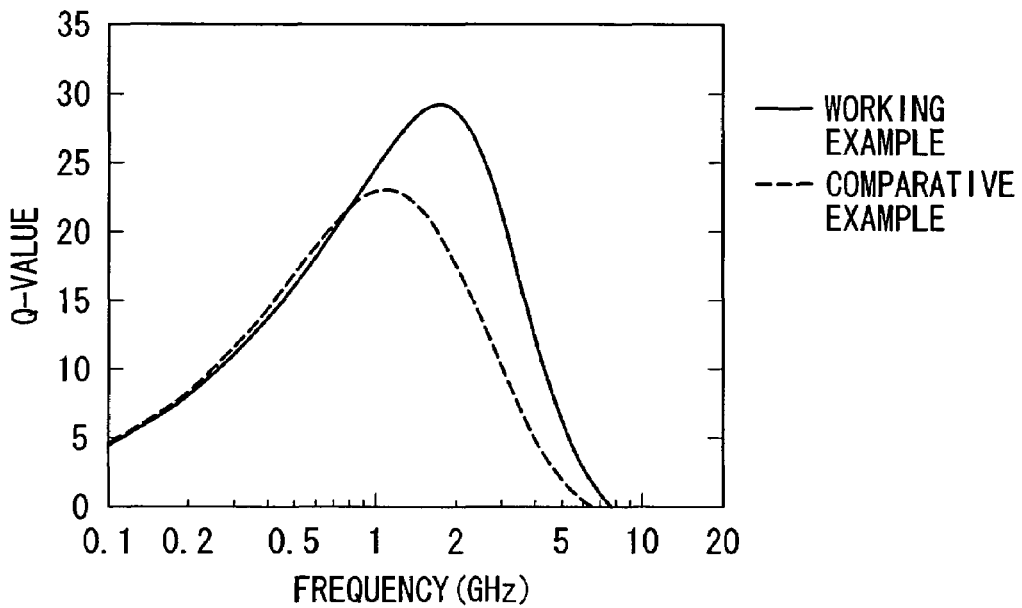
FIG. 9 is a graph illustrating an example of the relationship between frequency and the Q value for semiconductor devices having an induction element that is positioned in various locations.

In FIG. 9, the solid line shows the Q values of the semiconductor elements of the working example in which the dielectric element was provided in the second wiring layer. Furthermore, the dashed line shows the Q values of the semiconductor elements of the comparative example in which the dielectric element was provided in the first wiring layer.

The results of FIG. 9 indicate that an inductor having a high Q value can be realized by disposing the dielectric element distant from the semiconductor substrate when two wiring layers are provided.

Thicknesses of Insulating Resin Layers

As shown in Table 1, a plurality of semiconductor devices were manufactured while varying the sum of the layer thicknesses of the first insulating resin layer and the second insulating resin layer, and the Q values of these semiconductor devices at a frequency of 2 GHz were measured.

In these semiconductor devices, the first wiring layer positioned close to the semiconductor substrate is an interconnection wiring (under path), and the second wiring layer distant from the semiconductor substrate is a dielectric element.

Figure 10:
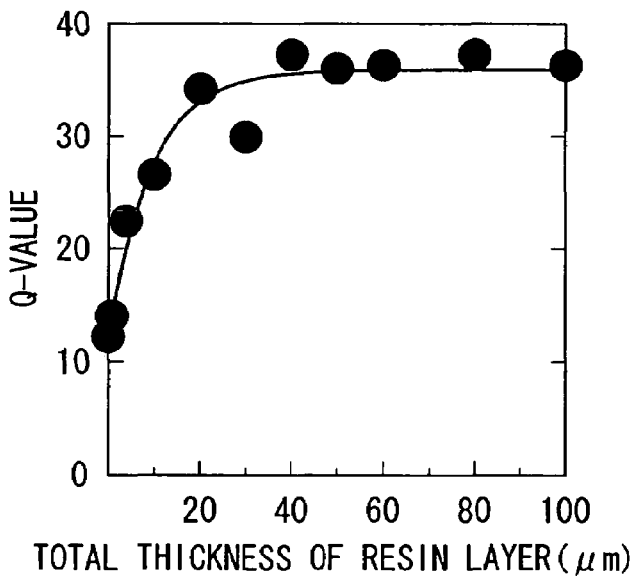
FIG. 10 is a graph illustrating an example of the relationship between the sum of the layer thicknesses of the first insulating resin layer and the second insulating resin layer (total thickness of all resin layers) and the Q value.

The relationship between the sum of the layer thicknesses of the first insulating resin layer and the second insulating resin layer (total thickness of all resin layers) and the Q value is shown in FIG. 10 and Table 1. These results indicate that a Q value of 20 or higher was obtained when the sum of the layer thicknesses of the first insulating resin layer and the second insulating resin layer was no less than 5 μm and not more than 60 μm. In this case, the effect of enhancing the Q value is favorable whereas the total thickness of the insulating resin layers is prevented from being unnecessarily increased.

TABLE 1

| Sum of Thicknesses of First and Second Insulating Resin Layers (μm) | Q Value (at 2 GHz) |
|---|---|
| 1 | 12.2 |
| 2 | 14.2 |
| 5 | 22.4 |
| 10 | 26.5 |
| 20 | 34.0 |
| 30 | 29.8 |
| 40 | 37.1 |
| 50 | 36.0 |
| 60 | 36.3 |
| 80 | 37.1 |
| 100 | 36.1 |

Thickness of Conductive Layer

A plurality of semiconductor devices were manufactured while varying the thickness of the first wiring layer when fixing the thickness of the second wiring layer to 10 μm.

In these semiconductor devices, the first wiring layer positioned close to the semiconductor substrate is an interconnection wiring (under path), and the second wiring layer distant from the semiconductor substrate is a dielectric element.

Figure 11:
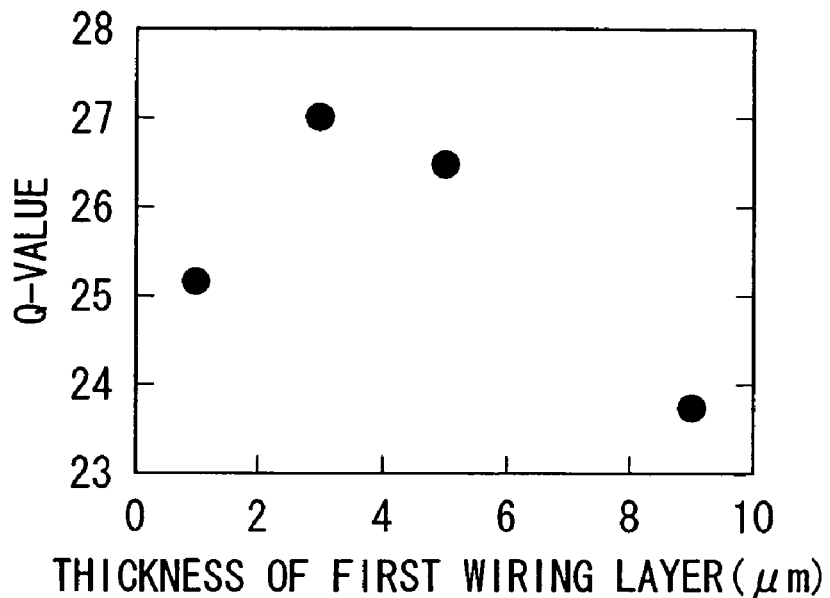
FIG. 11 is a graph illustrating an example of the relationship between the thickness of the first wiring layer and the Q value of the semiconductor device.

FIG. 11 shows the measured Q values of the semiconductor devices in which the thickness of the first wiring layer is 1 μm, 3 μm, 5 μm, or 9 μm, and the thickness of the second wiring layer is 10 μm at a frequency of 2 GHz. In this measurement, the thickness of the first insulating resin layer was 10 μm, and the thickness of the second insulating resin layer was 10 μm.

The results of FIG. 11 indicate that a semiconductor device having an even higher Q value can be realized when a value obtained by dividing the thickness of the first wiring layer by the thickness of the second wiring layer is between 0.3 and 0.5.

Figure 12:
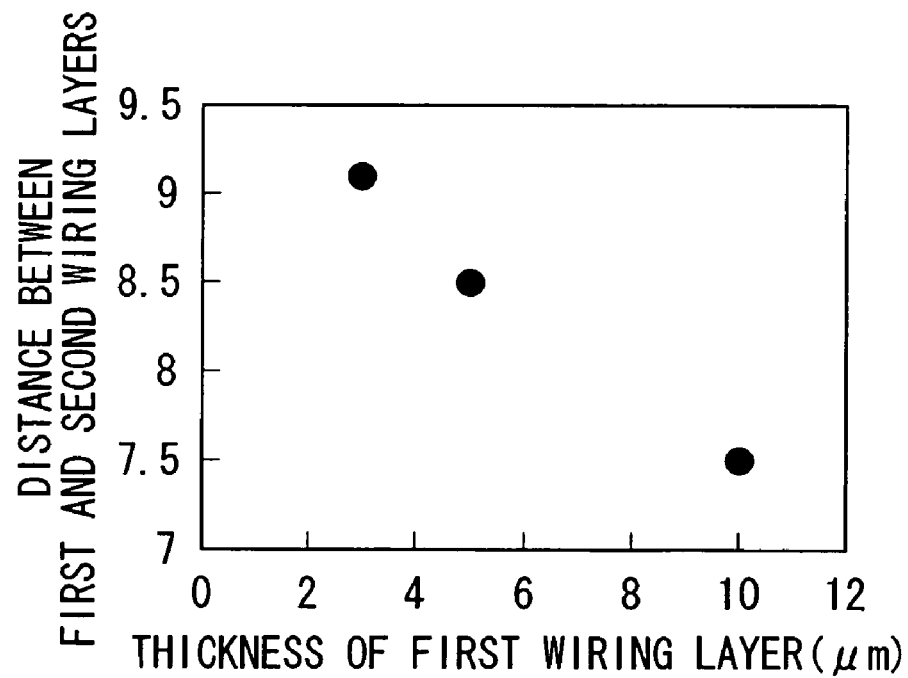
FIG. 12 is a graph illustrating an example of the relationship between the thickness of the first wiring layer and the distance between the first wiring layer and the second wiring layer.

FIG. 12 shows measured distances between the first wiring layer and the second wiring layer of semiconductor devices in which the thickness of the second insulating resin layer (the thickness right above the first insulating resin layer) was 10 μm and the thickness of the first wiring layer was 3 μm, 5 μm, or 10 μm. Upon the measurement shown in FIG. 12, the thickness of the first insulating resin layer was 10 μm, and the thickness of the second wiring layer was 10 μm.

As indicated by the graph in FIG. 12, as the ratio of the thickness of the first wiring layer to the thickness of the second insulating resin layer decreases, the distance between the first wiring layer and the second wiring layer increases. This indicates that an excellent semiconductor device having a high Q value is obtained as the ratio of the thickness of the first wiring layer to the thickness of the second insulating resin layer decreases.

Hereafter, alternative embodiments of the present invention will be described with reference to the drawings.

Figure 13:
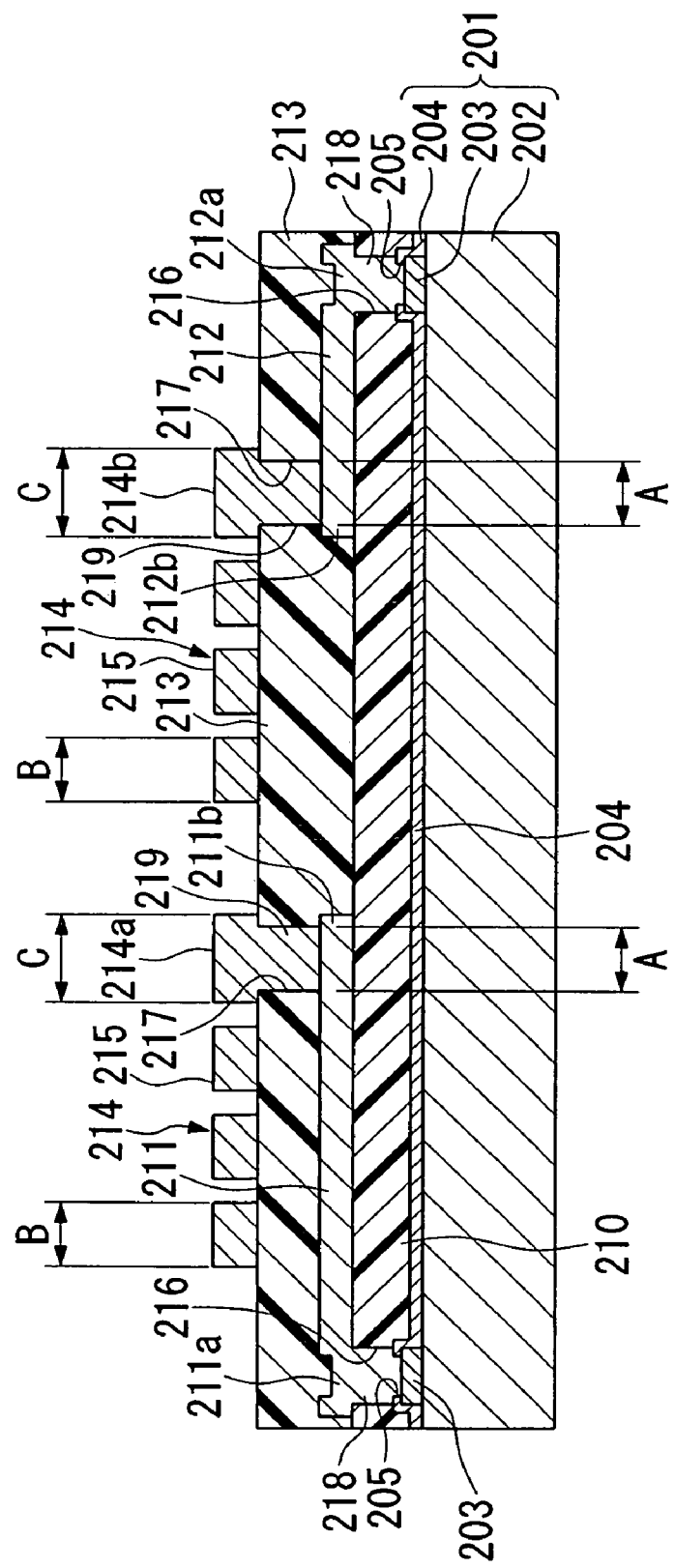
FIG. 13 is a figure showing an alternative example of a semiconductor device according to the present invention.
Figure 14:
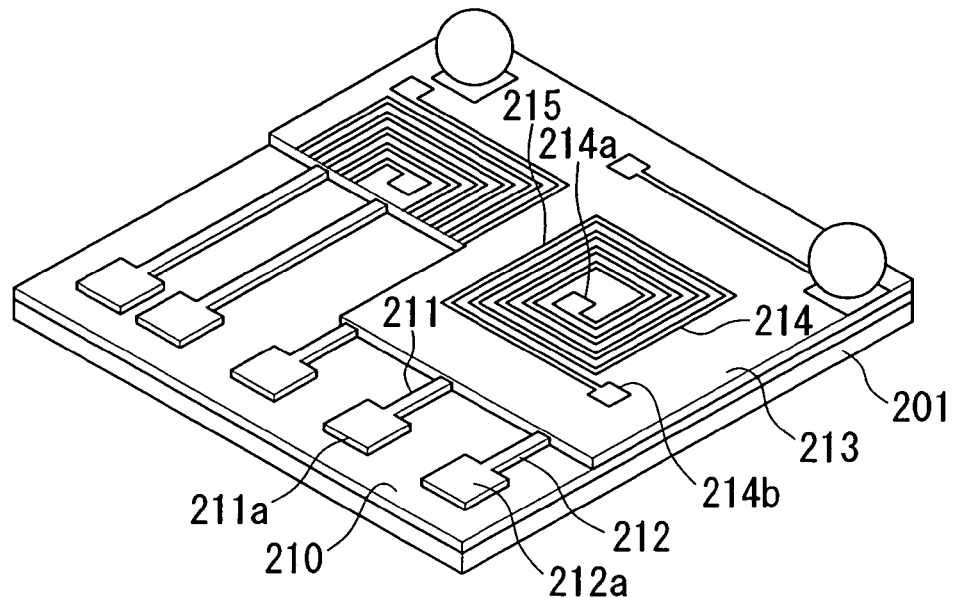
FIG. 14 is a partially broken perspective view of the semiconductor device shown in FIG. 13.
Figure 15:
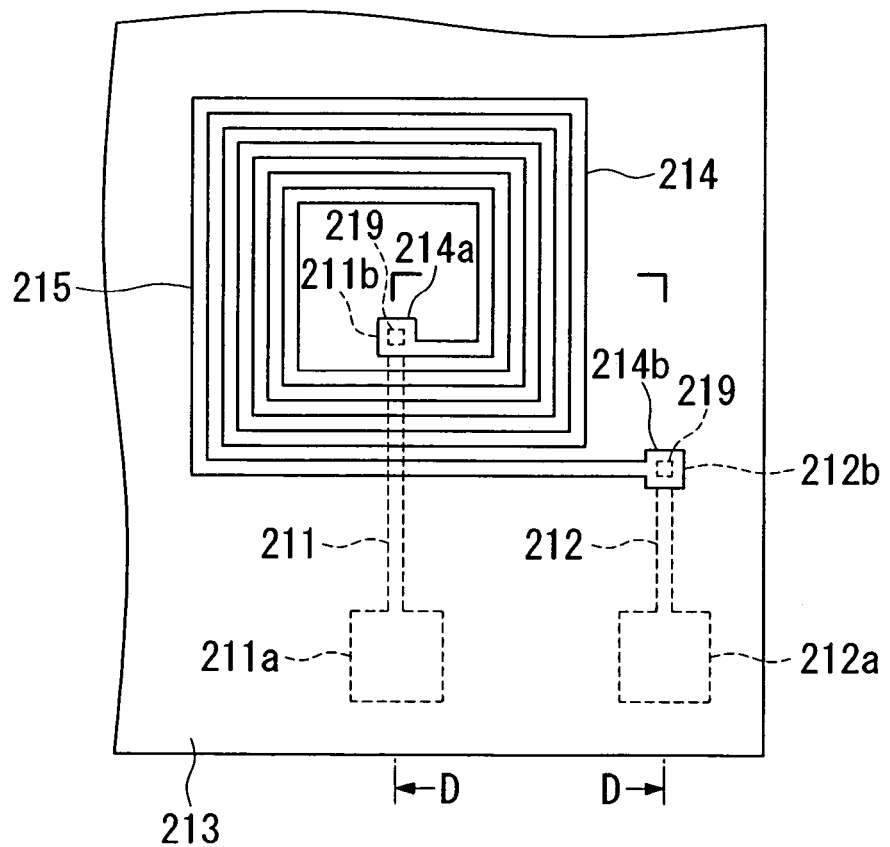
FIG. 15 is a plan view illustrating a main portion of the semiconductor device shown in FIG. 13.
Figure 16:
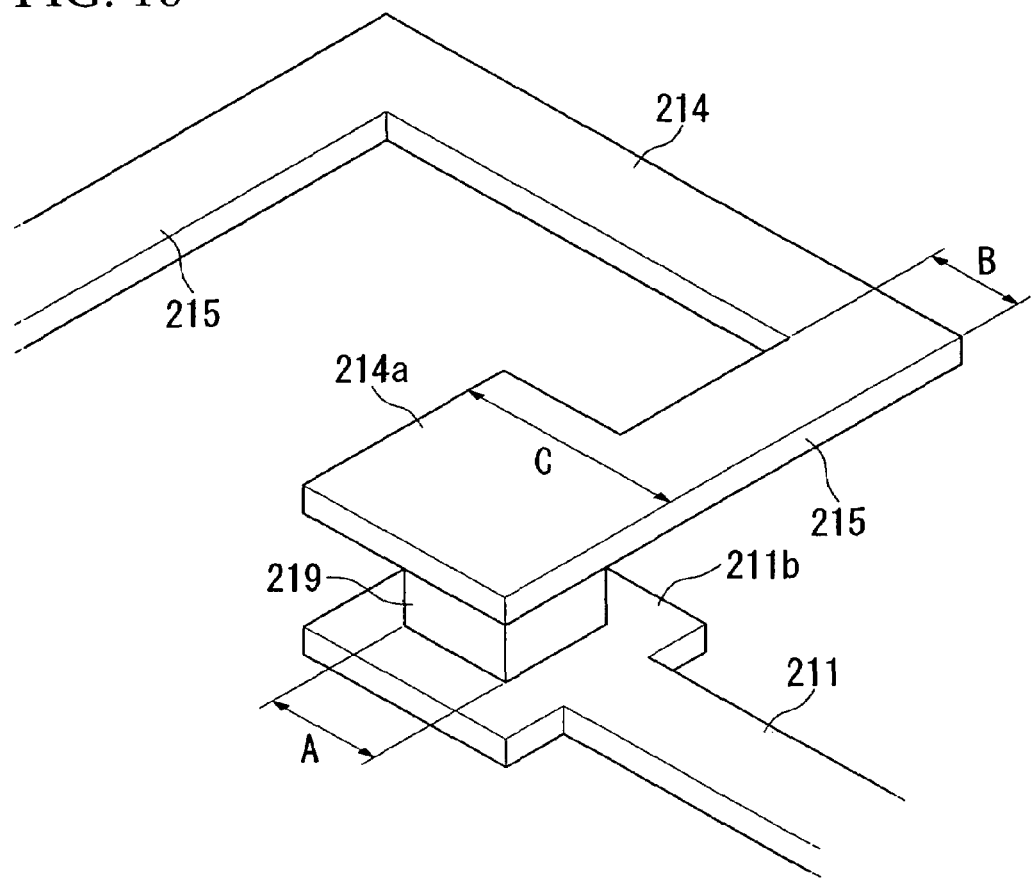
FIG. 16 is a perspective view illustrating a main portion of the semiconductor device shown in FIG. 13.
Figure 17:
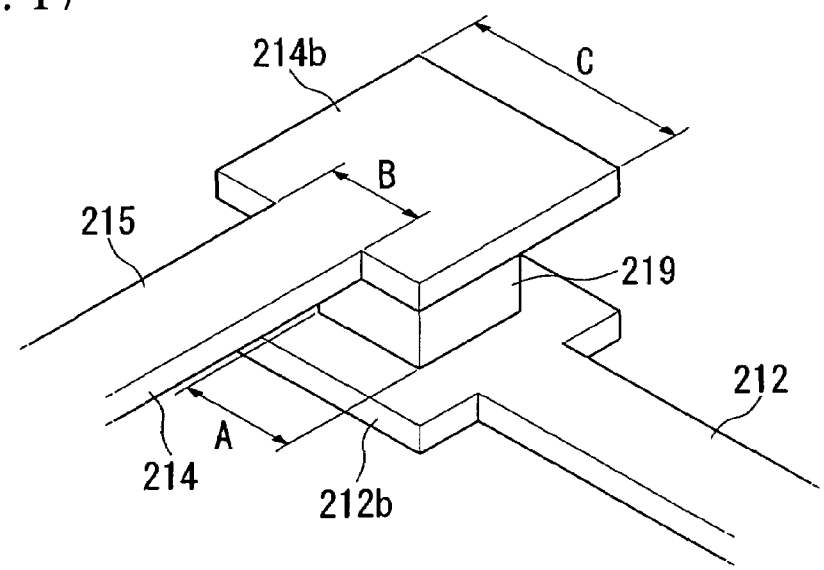
FIG. 17 is a perspective view illustrating a main portion of the semiconductor device shown in FIG. 13.

FIGS. 13 to 17 illustrate an alternative embodiment of the semiconductor device according to the present invention. FIG. 13 is a cross-sectional view, FIG. 14 is a partially broken perspective view, FIG. 15 is a plan view of a main portion, and FIG. 16 and FIG. 17 are perspective views of the main portion. FIG. 13 is a cross-sectional view taken along line D-D shown in FIG. 15.

As shown in FIG. 13, this semiconductor device includes a semiconductor substrate 201, a first insulating resin layer 210 provided over the semiconductor substrate 201, first wiring layers 211 and 212 provided on the first insulating resin layer 210, a second insulating resin layer 213 provided over the first insulating resin layer 210 and the first wiring layers 211 and 212, and a second wiring layer 214 provided on the second insulating resin layer 213.

The semiconductor substrate 201 is a base material 202, such as a silicon wafer, above which electrodes 203 of an integrated circuit (not shown) and a passivation film 204 are formed.

The electrodes 203 may be formed of aluminum, copper, or the like.

The passivation film 204 is a passivated insulator film, and may be made of SiN, $SiO_2$, or the like.

In the passivation film 204, openings 205 are defined in the positions corresponding to the electrodes 203, and the electrodes 203 are exposed from the openings 205.

The passivation film 204 may be formed, for example, using any well-known method, such as the LPCVD technique, and the film thickness thereof is between 0.1 µm and 0.5 µm, for example.

According to the present invention, the semiconductor substrate may be a semiconductor wafer, such as a silicon wafer, or may be a semiconductor chip. Semiconductor chips can be obtained by forming groups of various semiconductor elements, ICs, or induction elements on a semiconductor wafer, and then dicing the semiconductor wafer to the size of a chip.

The first insulating resin layer 210 has first openings 216 defined so as to open in the position corresponding to each of the electrodes 203.

The first insulating resin layer 210 may be made of, for example, a polyimide resin, an epoxy resin, a silicone resin, or the like, and the thickness thereof may be, for example, between 1 µm and 30 µm.

The second insulating resin layer 213 has openings 217 defined in the position corresponding to the two ends of the second wiring layer 214.

The second insulating resin layer 213 may be made of, for example, a polyimide resin, an epoxy resin, a silicone resin, or the like.

Since the first wiring layers 211 and 212 and the second wiring layer 214 are spaced apart with a sufficient distance by setting the thickness of the second insulating resin layer 213 to 10 µm or greater, it is possible to reduce energy loss and increase the Q value. The thickness of the second insulating resin layer 213 is preferably between 10 µm and 20 µm.

The insulating resin layers 210 and 213 may be formed using any well-known method, for example, the spin coating method, the printing method, the lamination method, or the like. The openings 216 and 217 may be defined using a patterning technique or the like, by means of photolithography, for example.

The first wiring layers 211 and 212 (first conductive layer) are redistribution layers connecting between the electrodes 203 and the second wiring layer 214. First ends 211a and 212a of the first wiring layers 211 and 212 are connected to the electrodes 203 via first junctions 218 formed in the first openings 216.

As shown in FIGS. 13, 16, and 17, contact pads 211b and 212b having an substantially rectangular plate shape are provided on the first wiring layers 211 and 212.

The contact pads 211b and 212b are provided in the positions corresponding to the second openings 217, and are formed so that the length and the width thereof are greater than the width of the first wiring layers 211 and 212.

The material of the first wiring layers 211 and 212 may be, for example, aluminum or copper, and the thickness thereof may be, for example, between 1 µm and 20 µm. The first wiring layer 211 and 212 may be formed using any well-known method, for example, sputtering, evaporation, plating, or the like.

As shown in FIGS. 13 to 15, the second wiring layer 214 (second conductive layer) includes a spiral coil 215 as an induction element.

The material of the second wiring layer 214 may be, for example, copper, and the thickness thereof may be, for example, between 1 µm and 20 µm. The second wiring layer 214 may be formed using, for example, plating technique, such as copper electroplating or the like, sputtering, evaporation, or the like.

Contact pads 214a and 214b in an substantially rectangular plate shape are provided to the two ends of the second wiring layer 214.

The contact pads 214a and 214b are provided in the positions corresponding to the second openings 217, and are formed so that the length and the width thereof is greater than the width of the second wiring layers 214.

The contact pads 214a and 214b are connected to the contact pads 211b and 212b of the first wiring layers 211 and 212 via second junctions 219 defined in the second openings 217, respectively.

The aspect ratio, i.e., the ratio of the minimum width and the length (the thickness of the second insulating resin layer 213) (width/length) of the second openings 217 is too small, a metal material is not completely filled in the second openings 217 upon defining the second junctions 219, resulting in malformation of the second junctions 219. For the above reason, the aspect ratio is preferably 1 or greater.

The second junctions 219 are defined along the walls of the second openings 217.

In the example shown in the figures, the second junctions 219 has a prism shape having a rectangular cross-section, and the four sides thereof are parallel to each of the edges of the contact pad 214a, 214b, 211b, or 212b.

The second junctions 219 are preferably provided substantially at the center of the contact pad 214a, 214b, 211b, or 212b.

The width of the second junctions 219 (width A shown in FIGS. 13, 16, and 17) is set to be the same as or greater than the line width of the second wiring layer 214 that constructs the spiral coil 215 (width B shown in FIGS. 13, 16, and 17 the spiral coil 215).

By setting the width of the second junctions 219 to fall within the above-described range, impedance mismatching within the spiral coil 215 can be prevented and a high Q value can be achieved.

The difference between the width of the second junctions 219 and the line width of the second wiring layer 214 that constructs the spiral coil 215 (A–B) is preferably set to 10 µm or smaller.

The difference between the width of the contact pads 214a, 214b, 211b, and 212b (shown in FIGS. 13, 16, and 17 width C) and the width of the second junctions 219 (shown in FIGS. 13, 16, and 17 width A) (C–A) is preferably 30 µm or smaller. By setting the difference between the widths to fall within the above-described range, a high Q value can be achieved.

The above-described difference between the widths is preferably 10 µm or greater so that connection failure can be prevented even when the second junctions 219 are formed misaligned.

The ratio of the contact pads 214a, 214b, 211b, and 212b C to the width of the second junctions 219 A (C/A) is preferably 2 or less. By setting the ratio (C/A) to fall within this range, a high Q value can be achieved.

The ratio (C/A) is preferably or 1.33 or greater because connection failure can be prevented even when the second junctions 219 are formed misaligned.

The difference between the area of the contact pad 214a, 214b, 211b, or 212b and the cross-sectional area of the second junctions 219 is preferably 2700 μm² or less. By setting the difference in the areas to fall within the above range, a high Q value can be achieved.

The above difference in the areas is preferably 700 μm² or greater so that connection failure can be prevented even when the second junctions 219 are formed misaligned.

The ratio the area of the contact pad 214a, 214b, 211b, or 212b to the cross-sectional area of the second junctions 219 is preferably 4 or less. By setting the difference in the areas to fall within the above range, a high Q value can be achieved.

The above area ratio is preferably 1.78 or greater so that connection failure can be prevented even when the second junctions 219 are formed misaligned.

The difference in widths, the width ratio, the difference in areas, and the area ratio of the contact pad 214a, 214b, 211b, or 212b and the second junctions 219 are preferably satisfied for all of the contact pads 214a, 214b, 211b, and 212b. However, the above advantageous effects are achieved even when above-described conditions are met for any one of the contact pads to which the second junctions 219 are connected.

It should be noted that the width of the second wiring layer 214 constructing the spiral coil 215 as used herein refers to an average width of the spiral coil 215.

Furthermore, the widths of the contact pads 214a, 214b, 211b, and 212b and the second junctions 219 as used herein refer to a maximum width.

A sealing layer (not shown) may be provided above the second insulating resin layer 213 and the second wiring layer 214 covering at least the second wiring layer 214, according to requirements.

The sealing layer may be made of, for example, a polyimide resin, an epoxy resin, a silicone resin, or the like, and the thickness thereof may be between 5 μm and 20 μm, for example. Openings (not shown) for connecting to terminals of outside elements may be defined in the sealing layer.

Next, a method for manufacturing the semiconductor device mentioned above will be described.

FIGS. 18A to 18E are schematic cross-sectional views illustrating an example of a method for manufacturing the above-described semiconductor device. FIGS. 18A to 18E are cross-sectional views taken along line D-D shown in FIG. 15.

Figure 18A:
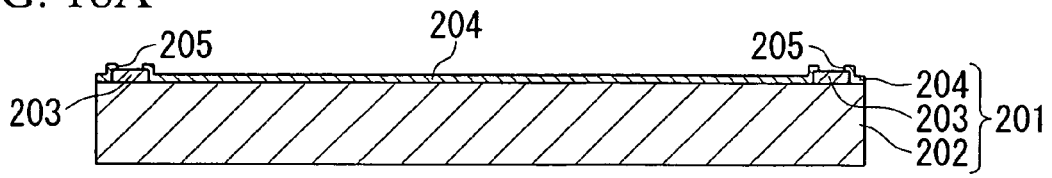
FIGS. 18A to 18E are schematic cross-sectional views stepwise illustrating an example of a method for manufacturing the semiconductor device shown in FIG. 13.
Figure 18B:
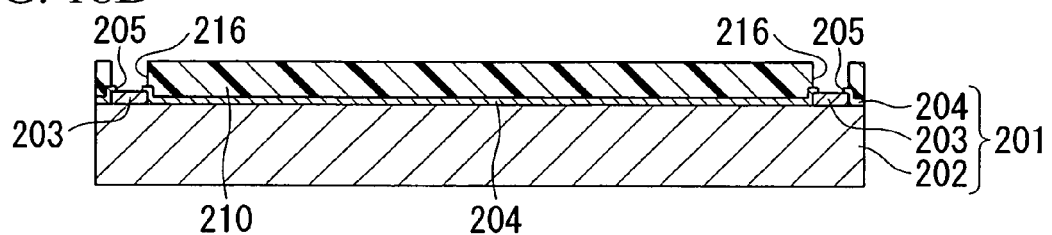

Next, as shown in FIGS. 18A and 18B, the first insulating resin layer 210 having the first openings 216 is formed on the passivation film 204 of the semiconductor substrate 201.

The first insulating resin layer 210 may be formed, for example, using the following methods.

The second insulating resin layer 210 may be formed, for example, by forming a film made of one or more of the above-described resins over the entire surface of the passivation film 204 using any well-known method, for example, the spin coating method, the printing method, the lamination method, or the like (first insulating resin layer formation step).

Next, the first openings 216 may be defined using a patterning technique or the like, by means of photolithography, for example, in the positions corresponding to the electrodes 203 (first opening formation step).

Figure 18C:
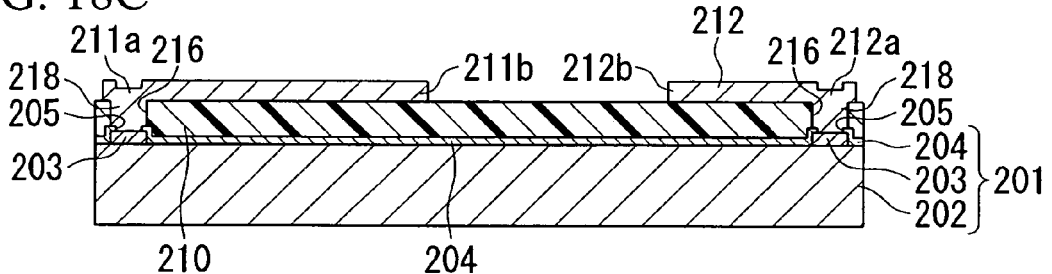

As shown in FIG. 18C, the first wiring layers 211 and 212 are formed on the first insulating resin layer 210 (first wiring layer formation step).

The first wiring layers 211 and 212 may be formed, for example, using the following methods.

A seed layer is formed on the first insulating resin layer 210 using a sputtering technique or the like. The seed layer is, for example, a stacked body including a copper layer and a chromium (Cr) layer, or a stacked body including a copper layer and a titanium (Ti) layer.

Next, a resist layer (not shown) for electroplating is formed on the seed layer. The resist layer is formed on regions other than where the first wiring layers 211 and 212 are to be provided.

The first wiring layers 211 and 212 made of copper, for example, are formed on the seed layer using electroplating or the like, and the first junctions 218 are formed in the first openings 216. After forming the first wiring layers 211 and 212 and the first junctions 218, unnecessary portions of the resist layer and the seed layer are removed by etching them.

Figure 18D:
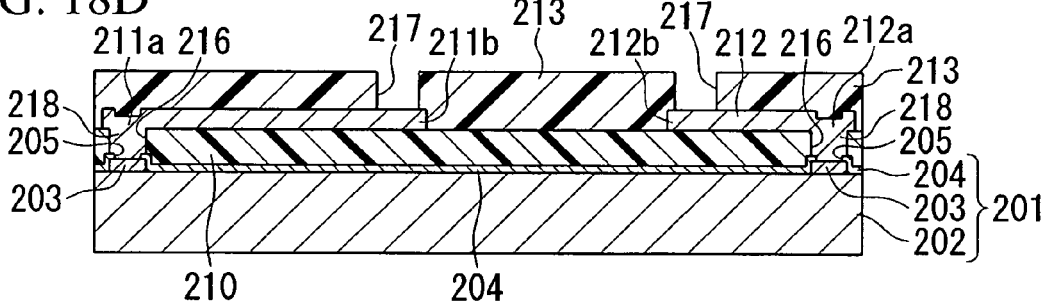

As shown in FIG. 18D, the second insulating resin layer 213 is formed over the first insulating resin layer 210 and the first wiring layers 211 and 212.

The second insulating resin layer 213 may be formed, for example, using the following methods.

A film made of one or more of the above-described resins is formed using any well-known method, for example, the spin coating method, the printing method, the lamination method, or the like, over the entire surface of the first insulating resin layer 210 and the first wiring layers 211 and 212 (second insulating resin layer formation step).

Next, the second openings 217 are defined using a patterning technique or the like, by means of photolithography, for example, in positions corresponding to the contact pads 211b and 212b of the first wiring layers 211 and 212 (second opening formation step).

Figure 18E:
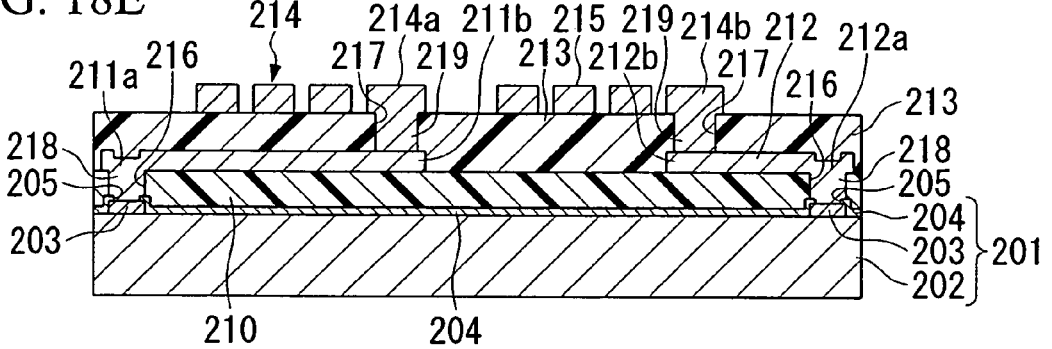

As shown in FIG. 18E, the second wiring layer 214 having the spiral coil 215 is formed on the second insulating resin layer 213 (second wiring layer formation step).

The second wiring layer 214 may be formed using the same method as the method for forming the first wiring layers 211 and 212.

In other words, a seed layer and a resist layer is formed above the second insulating resin layer 213. Then, the second wiring layer 214 made of copper or the like is formed on the seed layer using electroplating or the like, as well as forming the second junctions 219 in the second openings 217.

In the case where the sealing layer is provided above the second wiring layer 214, sealing layer may be formed, for example, by patterning a photosensitive resin, such as a photosensitive polyimide resin, using photolithography to form the sealing layer in predetermined positions.

Next, the operation and the effects of the semiconductor device of this embodiment will be explained.

(1) By setting the width of the second junctions 219A to be the same as or greater than the line width B of the second wiring layer 214 (the spiral coil 215), the flow of current is not blocked by the second junctions 219. Thus, loss can be maintained to a low level. In particular, impedance mismatching within the spiral coil 215 can be prevented at high frequencies.

Accordingly, a semiconductor device having a spiral coil 215 that exhibits a high Q value (quality factor) can be obtained.

(2) By setting the difference between the width of the contact pads 214a, 214b, 211b, and 212b and the width of the second junctions 219 (C−A) to 30 μm or less, the Q value of the spiral coil 215 can be further enhanced.

The reason why a high Q value is obtained by setting the above-described difference between the widths (C−A) to the above-described range is believed that variations in current distribution can be reduced when current flows in a contact pad. (3) Since the contact pad 214a, 214b, 211b, or 212b is shaped in a substantially rectangular shape, connection failure between the second junctions 219 and the contact pads 214a, 214b, 211b, and 212b rarely occurs even when the second junctions 219 are formed misaligned.

Although the second junctions 219 have a substantially constant width in the direction of the depth in the semiconductor device shown in FIG. 13, the present invention is not limited to such an embodiment.

Figure 19:
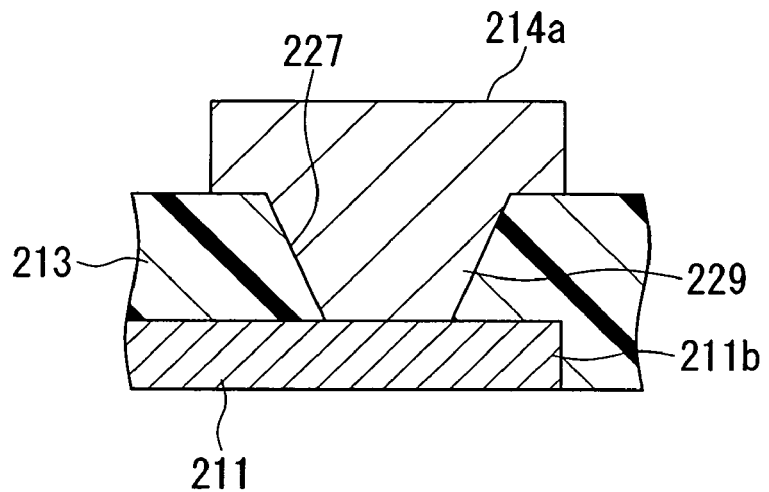
FIG. 19 is a cross-sectional view illustrating a variation of the second junction.

The semiconductor device shown in FIG. 19 is different from the semiconductor device shown in FIG. 13 in that the width of a second junction 229 gradually decreases with an increase in the distance from the surface.

The second junction 229 may be easily formed by defining a second opening 227 so that the width thereof is decreased with an increase in the distance from the surface.

In semiconductor device having the second junction 229, a metal material is evenly distributed to fill within the second opening 227 with no void when the second junction 229 is formed using electroplating or the like.

Accordingly, malformation of the second junction 229 can be prevented.

Figure 20:
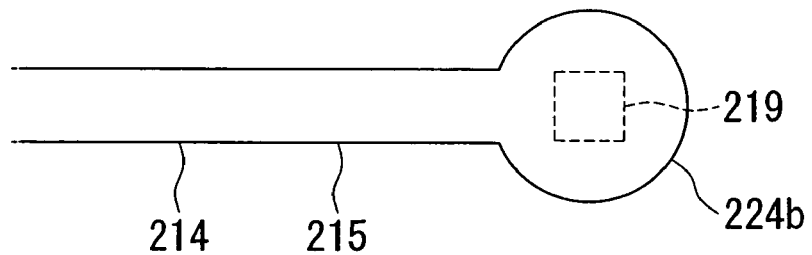
FIG. 20 is a plan view illustrating a variation of a contact pad.
Figure 21:
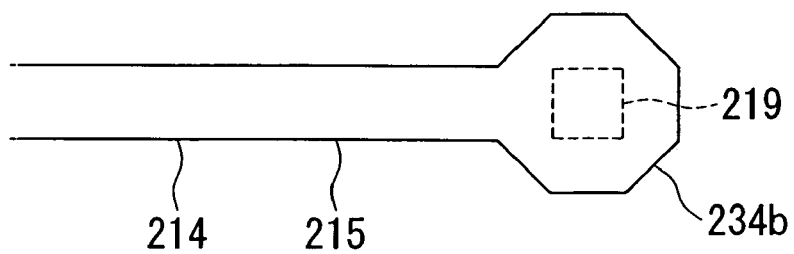
FIG. 21 is a plan view illustrating another variation of a contact pad.

FIGS. 20 and 21 illustrate other embodiments of contact pads.

A contact pad 224b shown in FIG. 20 has a substantially circular shape in plan view, which is different from the rectangular-shaped contact pads 214a, 214b, 211b, and 212b shown in FIGS. 14 to 17.

A contact pad 234b shown in FIG. 21 has a polygonal shape in plan view, which is different from the contact pads 214a, 214b, 211b, and 212b.

The contact pad 234b preferably has a polygonal shape having five (pentagon) or more sides. In the example shown in FIG. 21, the pad has an octagonal shape.

In the semiconductor device having the contact pads 224b and 234b, the Q value of the spiral coil 215 can be further enhanced. In particular, the semiconductor device having the substantially circular-shaped contact pad 224b exhibits a high Q value.

The reason why a high Q value is achieved is believed that variations in current distribution can be reduced when current flows in a contact pad.

EXAMPLES

Test Example 2-1 to 2-5

As shown in FIG. 13, semiconductor devices including the semiconductor substrate 201 that was a silicon substrate, the first insulating resin layer 210 made of a polyimide resin, the first wiring layers 211 and 212 made of copper, the second insulating resin layer 213 made of a polyimide resin, and the second wiring layer 214 made of copper were manufactured.

The thicknesses of the first insulating resin layer and the second insulating resin layer 210 and 213 were 10 μm.

The widths of the first wiring layers 211 and 212 were 30 μm.

The spiral coil 215 had 3.5 turns, and the line width thereof was 30 μm.

The second junctions 219 were formed in a square shape in cross-section and the width thereof was set to the values shown in Table 2.

The contact pads 214a, 214b, 211b, and 212b were formed in a square shape, and the width thereof was set to 50 μm.

The Q value of the spiral coil 215 was measured at a frequency of 2 GHz. The results are listed in Table 1.

TABLE 2

|  | Width of Second Junction (μm) | Width of Spiral Coil (μm) | Q Value (at 2 GHz) |
| --- | --- | --- | --- |
| Test Example 2-1 | 20 | 30 | 25.5 |
| Test Example 2-2 | 25 | 30 | 25.8 |
| Test Example 2-3 | 30 | 30 | 27.0 |
| Test Example 2-4 | 35 | 30 | 27.4 |
| Test Example 2-5 | 40 | 30 | 28.0 |

The results in Table 2 indicates that high Q values were achieved by setting the width of the second junctions 219 to be equal to or larger than the width of the spiral coil 215.

Test Example 2-6 to 2-10

The semiconductor devices shown in FIG. 13 were manufactured.

The second junctions 219 were formed in a square shape in cross-section and the width thereof was set to 30 μm.

The contact pads 214a, 214b, 211b, and 212b were formed in a square shape in cross-section and the widths thereof were set to 40 μm, 50 μm, 60 μm, 70 μm, or 80 μm. Other conditions were the same as those of Test Example 2-1.

The Q value of the spiral coil 215 was measured at frequencies between 0.1 GHz and 20 GHz. The results are shown in FIG. 22.

Figure 22:
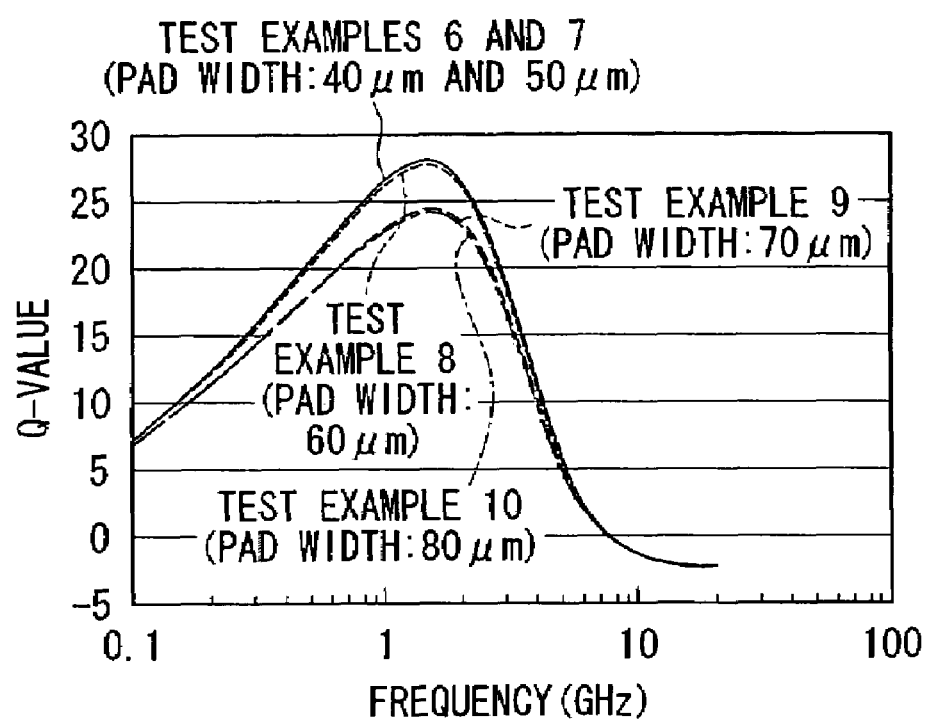
FIG. 22 is a graph showing the results of the tests.

The results in FIG. 22 indicate that higher Q values were achieved when the width of the contact pads 214a, 214b, 211b, and 212b were between 40 μm and 60 μm compared to when the width were between 70 μm and 80 μm.

Since the width of the contact pads was 30 μm, favorable results were achieved when the difference between the width of the contact pads and the width of the second junctions were 30 μm or less.

The present invention is applicable to various semiconductor device having an induction element, such as, for example, a semiconductor device for non-contact type IC tag in which the induction element functions as an antenna coil.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a semiconductor substrate having an electrode formed above a surface thereof;
   a first insulating resin layer that is provided over the semiconductor substrate and has a first opening defined at a position corresponding to the electrode;
   a wiring layer that is formed above the first insulating resin layer and is connected to the electrode through the first opening;
   a second insulating resin layer that is formed over the first insulating resin layer and the first wiring layer in the position corresponding to the first wiring layer, the second insulating resin layer having a second opening; and
a second wiring layer that is formed on the second insulating resin layer and has an induction element,
wherein the second wiring layer is connected to the first wiring layer via a junction provided in the second opening,
a width of the junction is equal to or greater than a line width of the second wiring layer that constructs the induction element,
a first contact pad and a second contact pad are provided to the first wiring layer and the second wiring layer, respectively,
the junction is provided between the first contact pad of the first wiring layer and the second contact pad of the second wiring layer, and
a difference between a width C of at least one of the first contact pad of the first wiring layer and the second contact pad of the second wiring layer and a width A of the junction (C-A) is 30 μm or less.

2. The semiconductor device according to claim 1, wherein the first contact pad and the second contact pad have one of a substantially rectangular shape, a substantially circular shape, or a polygonal shape having five or more sides.

3. The semiconductor device according to claim 1, wherein the induction element is a spiral coil.

4. The semiconductor device according to claim 2, wherein the induction element is a spiral coil.

* * * * *